US006891270B2

(12) United States Patent
Sugawara et al.

(10) Patent No.: US 6,891,270 B2
(45) Date of Patent: May 10, 2005

(54) SEMICONDUCTOR DEVICE AND METHOD OF MANUFACTURING THE SAME

(75) Inventors: Akira Sugawara, Kanagawa (JP); Nobuhiro Tanaka, Kanagawa (JP); Ichiro Uehara, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 24 days.

(21) Appl. No.: 10/245,701

(22) Filed: Sep. 18, 2002

(65) Prior Publication Data

US 2003/0090002 A1 May 15, 2003

(30) Foreign Application Priority Data

Sep. 20, 2001 (JP) ........................................ 2001-287648

(51) Int. Cl.[7] .................. H01L 23/48; H01L 23/52; H01L 23/40
(52) U.S. Cl. .................. 257/758; 257/750; 438/761
(58) Field of Search .................. 257/750, 758, 257/762, 751, 763, 764; 438/761, 622

(56) References Cited

U.S. PATENT DOCUMENTS

| | | | |
|---|---|---|---|
| 6,359,320 B1 | | 3/2002 | Yamazaki et al. |
| 6,479,900 B1 | * | 11/2002 | Shinogi et al. |
| 6,509,649 B1 | * | 1/2003 | Sugai |
| 6,515,365 B2 | * | 2/2003 | Higashi et al. |
| 6,573,602 B2 | * | 6/2003 | Seo et al. |
| 2002/0063287 A1 | | 5/2002 | Yamazaki et al. |
| 2002/0070382 A1 | | 6/2002 | Yamazaki et al. |
| 2002/0079503 A1 | | 6/2002 | Yamazaki et al. |

OTHER PUBLICATIONS

Hatano et al., "A Novel Self–aligned Gate–overlapped LDD Poly–Si TFT with High Reliability and Performance," IEDM 97, pp. 523–526.

Wolf, Stanley, *Silicon Processing for the VLSI Era*, vol. 2, Process Integration, pp. 256–257.
*2.1.1a History and Perspective of Cu Plating for ULSI Metallization*, The Latest Development on Copper Wire Technique, pp. 23–28.
*2.1.1b Cu Electro Plating and Cu Electroless Plating*, The Latest Development on Copper Wire Technique, pp. 29–39.
*2.1.1c, Coppper Plating Solution and Additives*, The Latest Development on Copper Wire Technique, pp. 40–44.
*2.1.1d Electrochemical Deposition Equipment Review*, The Latest Development on Copper Wire Technique, pp. 45–53.
*2.1.1e Chemistry and Apparatus of Plating Bath*, The Latest Development on Copper Wire Technique, pp. 54–58.
Cu Film–Formation by CVD Method Problem Focus Gradually Switch Over From Production Technique to Cost, Semiconductor World, 1997. 12, pp. 176–180.
Cu Film–Formation by Sputtering Improvement of Problem Embedding Property by Directional Sputtering, Semiconductor World, 1997., pp. 186–191.
Copper Plating Interconnection in ULSI Multilevel Interconnection Realization of Trench Metallization of 0.25 µm and Aspect Ratio 4, Semiconductor World, 1997.12, pp. 192–196.
Barrier Materials of Cu Damascene TaN and WN have Average Points, Semiconductor World, 1997.12, pp. 91–96.

* cited by examiner

Primary Examiner—S. V. Clark
(74) Attorney, Agent, or Firm—Eric J. Robinson; Robinson Intellectual Property Law Office, P.C.

(57) ABSTRACT

A simple technique of forming a low-resistant wire is provided in place of a Damascene method. In a three-layer wire composed of a first layer metal film wire, a second layer metal film wire that has fixed side etching portions, and an insulating film pattern, a low-resistant metal such as copper or silver is deposited in concave regions corresponding to the side etching portions of the second layer metal film wire through electrodeposition by electroplating. The above process is applied to a gate electrode and wire of a semiconductor device to obtain a semiconductor device that has high operation speed.

78 Claims, 13 Drawing Sheets

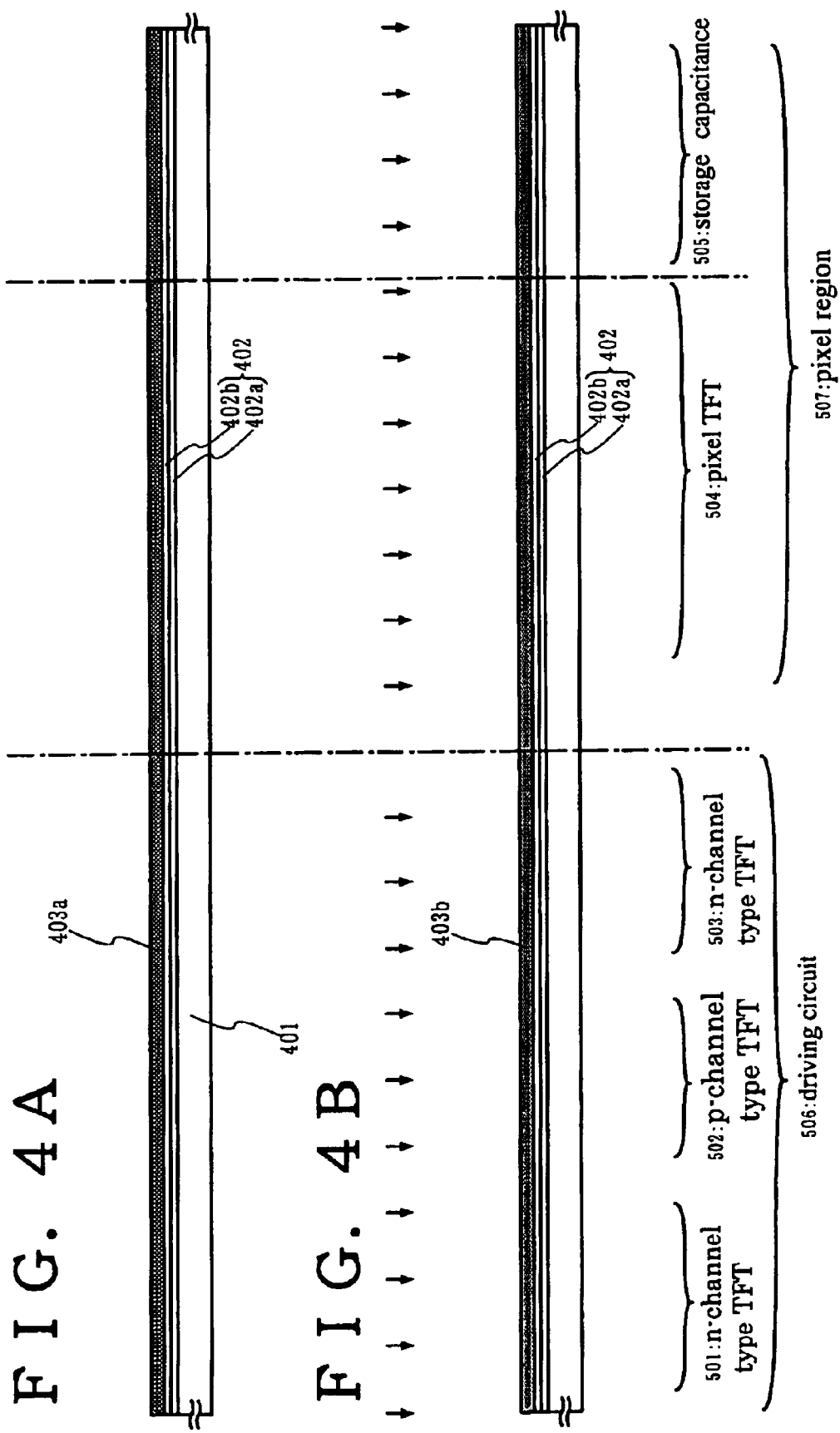

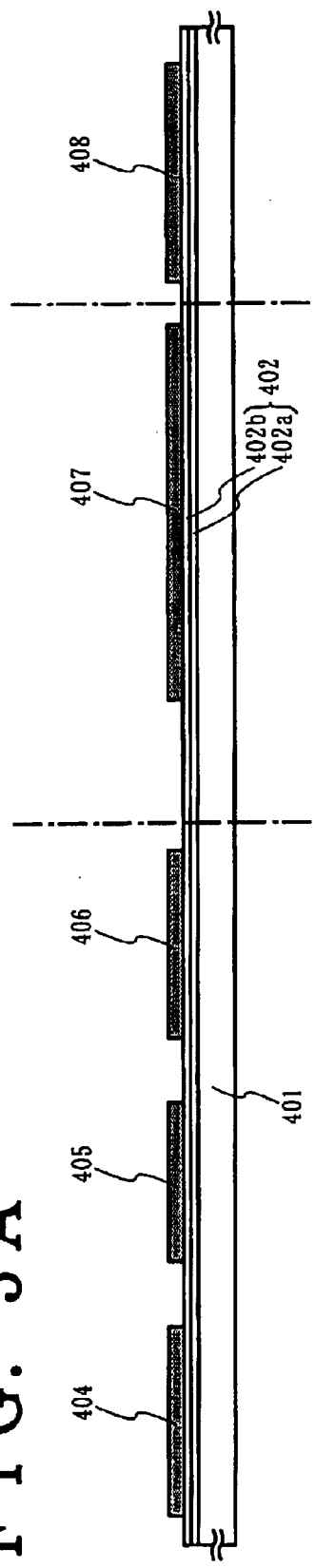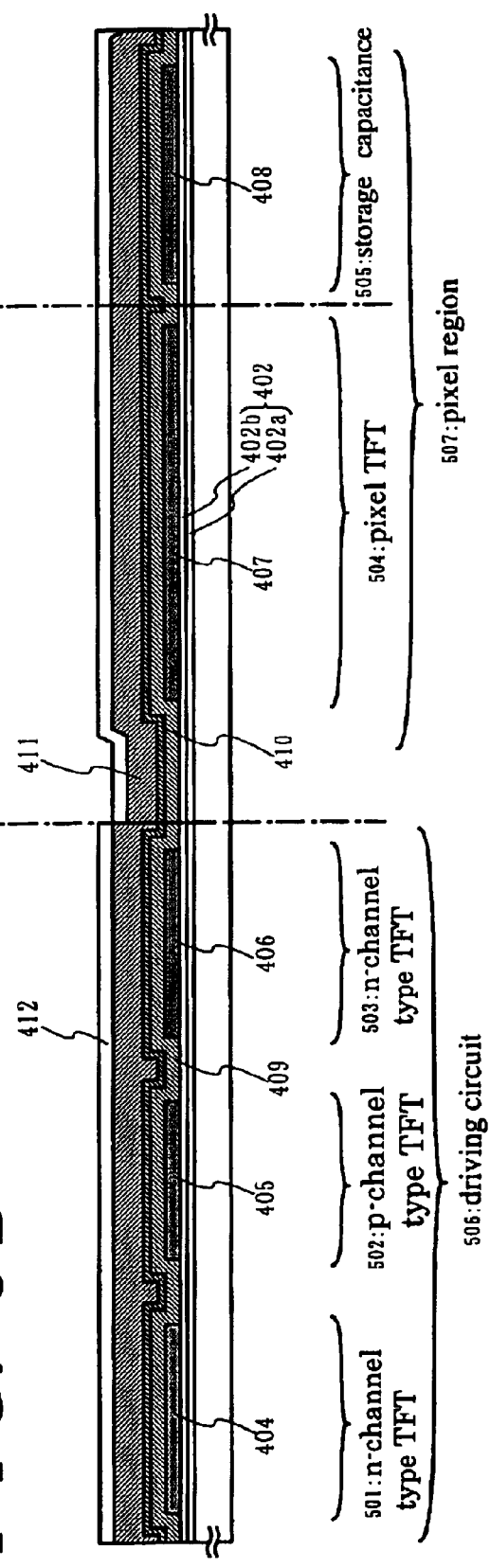

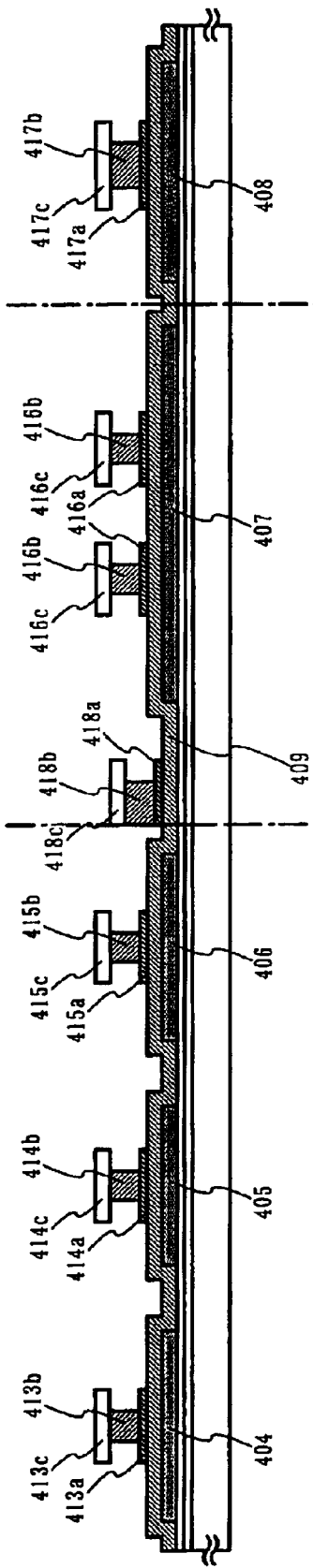
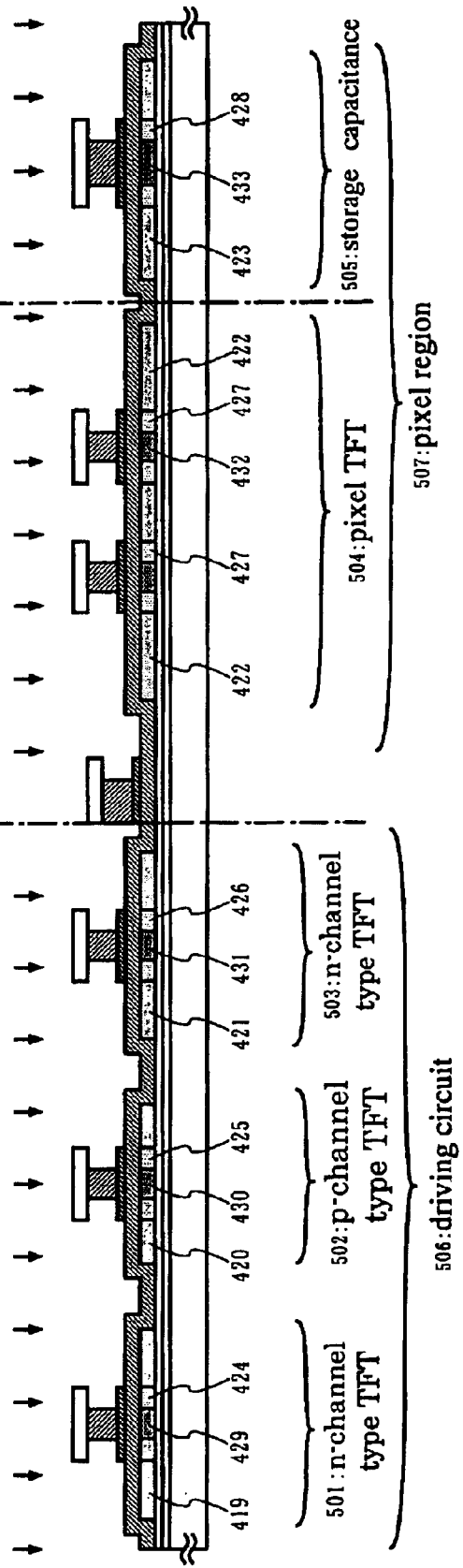

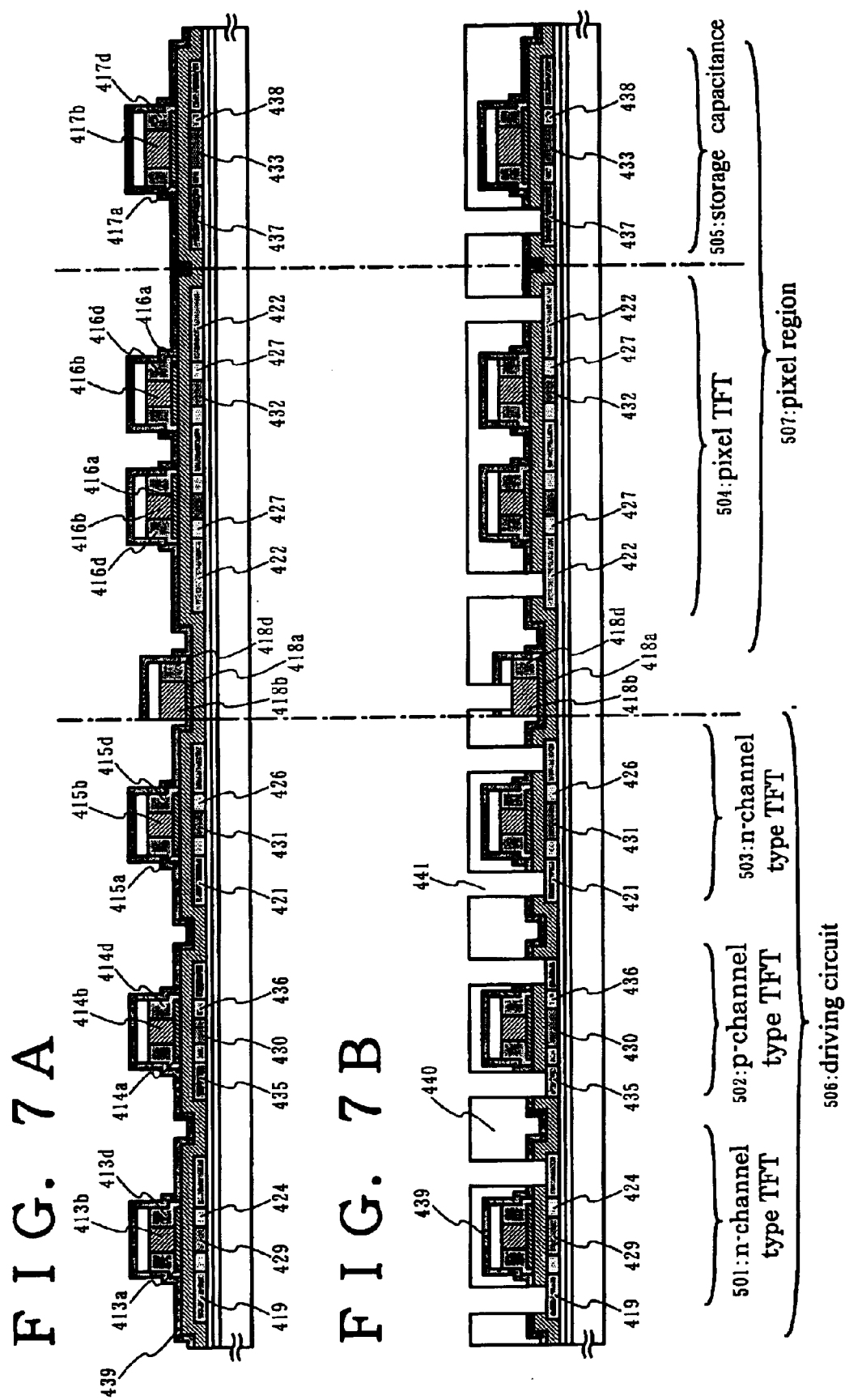

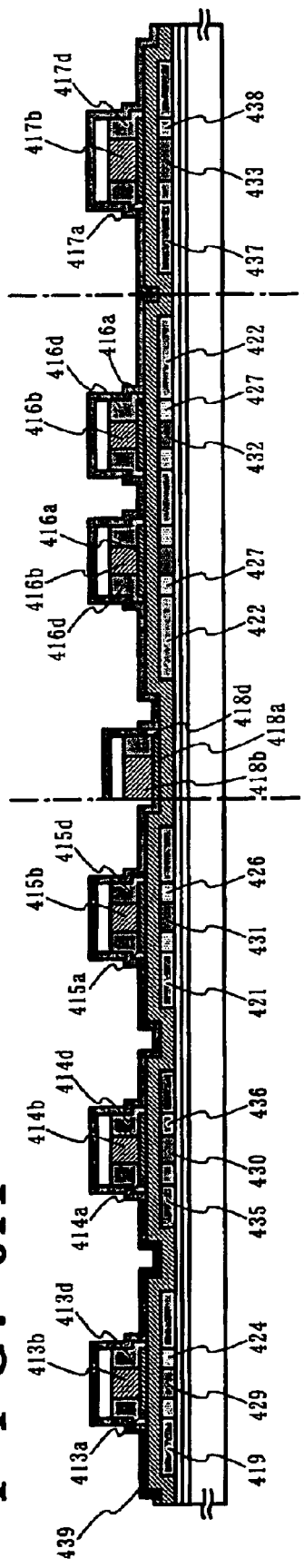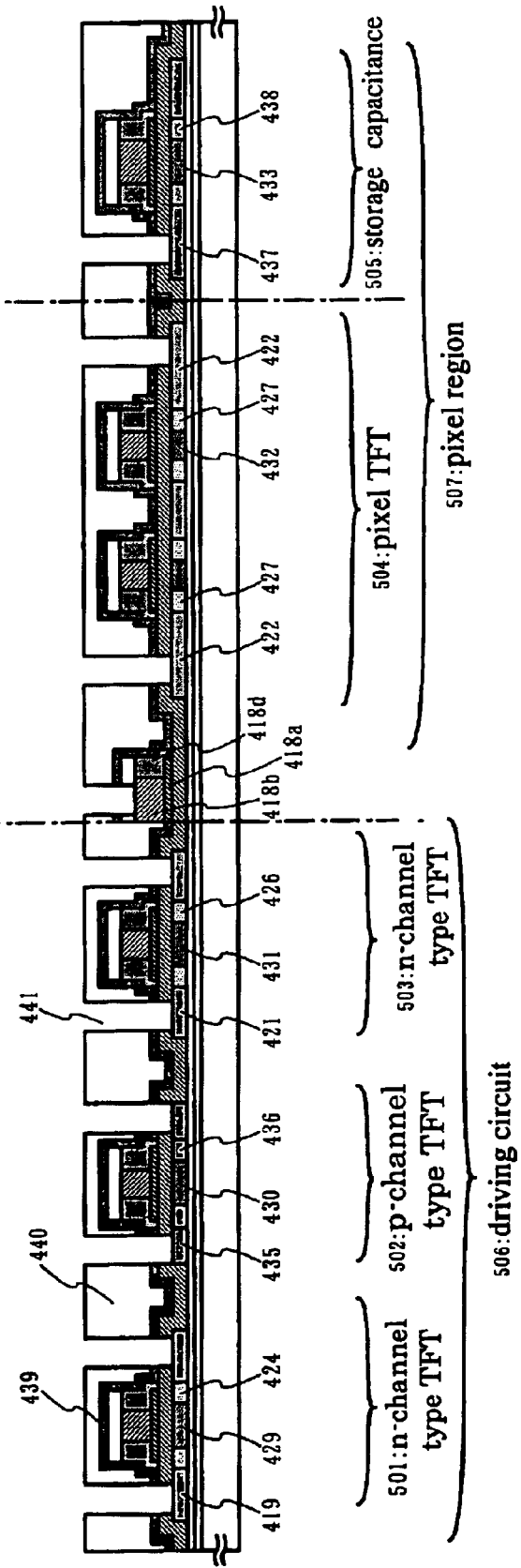
FIG. 8A
FIG. 8B

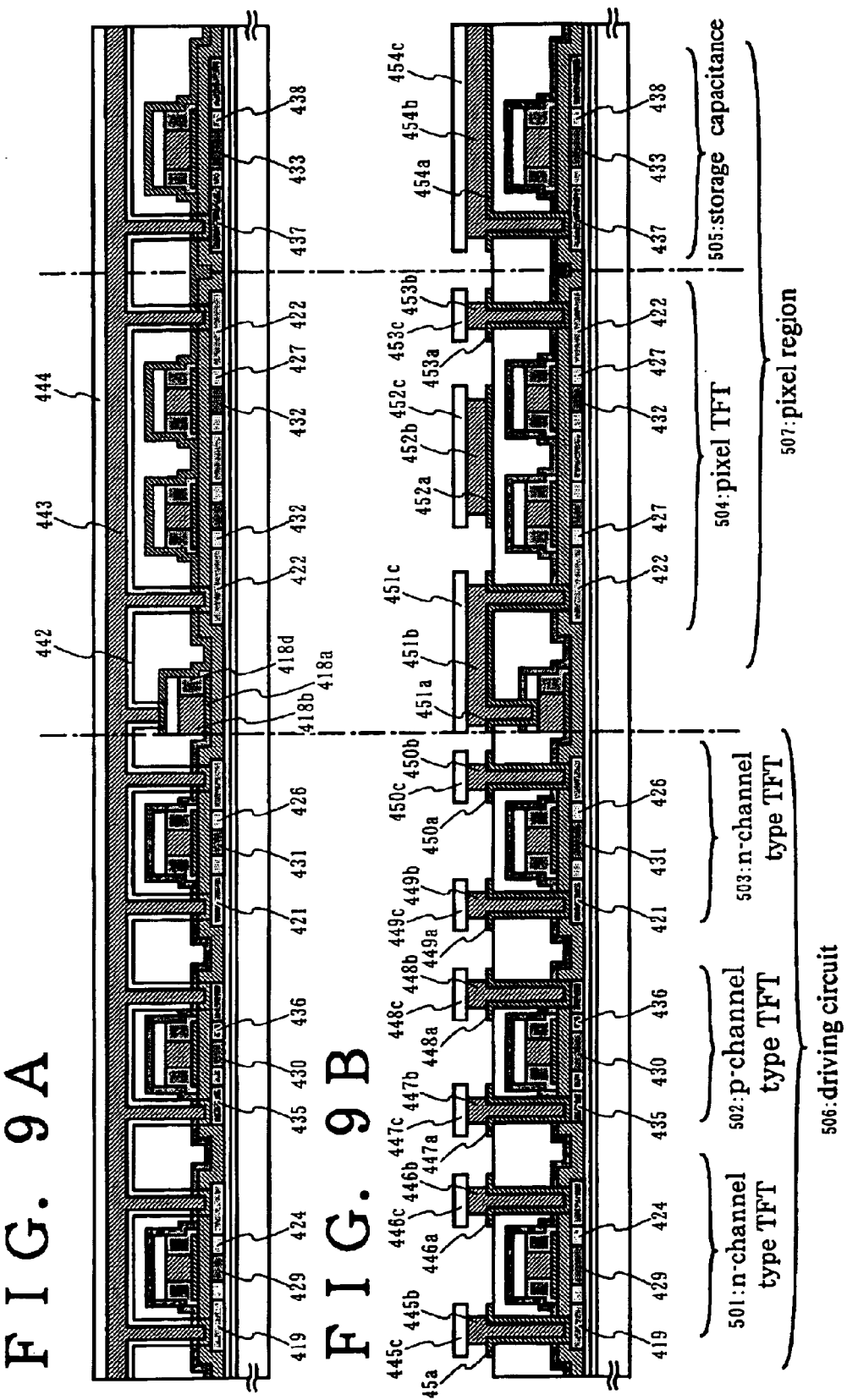

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, specifically to a semiconductor device having a low-resistant metal wire that is formed by using an electroplating technique and a method of manufacturing the semiconductor device. The term semiconductor device refers to devices in general that utilize semiconductor characteristics to function, and it includes a large-scale integrated circuit fabricated on a semiconductor substrate, a semiconductor display device in which circuits are built from thin film transistors formed on a transparent insulating substrate, and the like.

2. Description of the Related Art

Related art of the present invention are a technique of forming a copper (Cu) wire by a Damascene method in a large-scale integrated circuit (hereinafter abbreviated as LSI) and a technique of forming a thin film transistor (hereinafter abbreviated as TFT) that has a GOLD (acronym for gate-overlapped LDD) structure. The two techniques will be described as prior art.

[Copper Wire Forming Technique Using Damascene Method]

As micronization and densification are advanced in LSIs fabricated on silicon wafers or other semiconductor substrates, RC signal delay of wires is becoming the major factor that determines the operation speed of the LSIs. The advancement has also raised the need for a wire material that is lower in electric resistance than an aluminum (Al) wire conventionally used. Also a demand has risen as the current density is increased for a wire material more reliable than a conventional aluminum (Al) wire in terms of the ability of standing against electromigration (EM) and stress migration (SM). It is against this background that IBM (International Business Machines Corporation) developed a copper (Cu) wire forming technique using a Damascene method, which was presented at IEDM in 1997. With this as a turning point, semiconductor makers begun in earnest to develop a copper wire forming technique using a Damascene method. Now those techniques have already been put into practice in some of logic LSIs that have a design rule of 0.25 $\mu$m or less.

A copper wire forming technique using a Damascene method is a technique in which a given wire groove is formed in a part of an interlayer insulating film where a wire is to be formed, copper as a low-resistant wire material is embedded in the wire groove to form a copper film, and portions of the copper film that are outside the wire groove are removed by chemical mechanical polishing (hereinafter abbreviated as CMP) to form the wire while leaving copper inside the wire groove. There are two types of Damascene methods, a single Damascene method and a dual Damascene method. In a single Damascene method, a wire portion and a connection hole portion are formed separately whereas grooves of a wire portion and connection hole portion are formed and then copper is embedded in both grooves simultaneously in a dual Damascene method. The dual Damascene method is advantageous in cutting the process short since copper wires of the wire portion and connection hole portion are formed at the same time. On the other hand, the dual Damascene method has difficulty in forming a copper film by embedding in a connection portion of high aspect ratio (aspect ratio: 3 to 5). However, this difficulty is close to being solved because lately a technique of forming a copper film by embedding using electroplating has been established for a connection hole of high aspect ratio.

In the copper wire forming techniques described above, a copper wire has to be separated completely from the interlayer insulating film that is a silicon oxide film from two reasons; one is readiness of copper as a wire material for diffusion in a silicon oxide film and the other is oxidization of copper upon contact with the silicon oxide film. Accordingly, a thin diffusion preventing film for copper is formed in the groove so as to surround copper that is a wire material. As a technique for forming the diffusion preventing film, directional sputtering such as long throw sputtering and ionization sputtering, or MO (abbreviation for metal organic) CVD that uses an organic metal source has been developed. A high-melting point metal, nitride of a high-melting point metal, and a compound obtained by doping nitride of a high-melting point metal with silicon or boron are being examined as the material of the diffusion preventing film. Examples thereof include Ta, TaN, TaSiN, TiN, TiSiN, W, WN, WSiN, and WBN. On the diffusion preventing film, a thin copper seed layer is formed by directional sputtering or MO-CVD. The copper seed layer receives copper plating by electroplating, which is advantageous when the aspect ratio is high. Copper is thus embedded to form a film.

The copper wire forming technique using a Damascene method as this is a technique important and indispensable to a process of forming a multi-layer wire for a ultramicro LSI having a design rule of 0.25 $\mu$m or less. The Damascene method is an epoch-making technique that can achieve global planarization of a substrate in a process of forming a copper multi-layer wire and, since the wire is formed on a leveled surface, the technique is advantageous in electromigration (EM) and stress migration (SM). ArF excimer laser reduced projection exposure apparatus with the wavelength of exposure light set to 193 nm is employed to form an ultramicro pattern. While the ArF excimer laser reduced projection exposure apparatus is capable of resolving an ultramicro pattern of 0.2 $\mu$m or less, the apparatus has a problem of shallow penetration. The Damascen method is also advantageous in solving the problem of shallow penetration since the method achieves global planarization of a substrate.

The entirety of copper wire forming technique using a Damascene method is described in detail in, for example, "The Latest Development on Copper Wire Technique", edited by Shozo Ninomiyahara, Nobuyoshi Kuriya, Kazuyoshi Ueno, and Nobuhiro Misawa, published by Realize Co. (SIPEC Corporation). Many other documents have been published and, for example, an MO-CVD technique for copper is described in an article written by Nobuyoshi Kuriya in "Semiconductor World", December 1997, on pages 176 to 180. A directional sputtering technique is described in an article written by Nobuhiro Misawa in "Semiconductor World", December 1997, on pages 186 to 191. For an electroplating technique for copper, see an article written by V. M. Dubin and four others in "Semiconductor World", December 1997, on pages 192 to 196. A copper diffusion preventing film is described in an article written by Nobuyoshi Kuriya in "Semiconductor World", February 1998, on pages 91 to 96.

[GOLD Structure TFT Forming Technique]

Polycrystalline silicon TFTs having high field effect mobility are attracting attention in semiconductor display devices whose circuits are built from TFTs on glass substrates or other transparent insulating substrates, for example, active matrix liquid crystal display devices. Polycrystal silicon films used in polycrystalline silicon TFTs have higher electric field effect mobility of holes and electrons than conventional amorphous silicon films. Therefore polycrystalline silicon films have an advantage of being capable of integrating not only transistors for pixels but also driver circuits that are peripheral circuits. For that reason, many makers are developing active matrix liquid crystal display devices with their circuits built from polycrystalline silicon TFTs.

However, despite their high electric field effect mobility, polycrystalline silicon TFTs sometimes suffer lowering of electric field effect mobility when continuously driven, as well as reduction in ON current (current flowing when a TFT is ON), an increase in OFF current (current flowing when a TFT is OFF), and other degradation symptoms, resulting in reliability problems. These degradation symptoms are called hot carrier phenomenon, which is known to be caused by hot carriers generated in a high electric field in the vicinity of a drain.

The hot carrier phenomenon was first found in a MOS (abbreviation for metal oxide semiconductor) transistor fabricated on a semiconductor substrate, and has been proved to be due to a high electric field near a drain. Various kinds of basic examinations have been conducted about countermeasures against hot carriers and, in MOS transistors having a design rule of 1.5 $\mu$m or less, an LDD (abbreviation for lightly-doped drain) structure is employed. In an LDD structure, a low concentration impurity region (n− region or p− region) is formed in an end of a drain utilizing a gate side wall and the impurity concentration in the drain junction is graded to relieve electric field concentration in the vicinity of the drain.

The LDD structure is fairly improved in drain withstand voltage compared to a single drain structure. On the other hand, the LDD structure is large in resistance of low-concentration impurity region (n− region or p− region) and therefore has a drawback of reduced drain current. In addition, the high electric field region is positioned right below the side wall and electrolytic dissociation by collision reaches the maximum in the region to implant hot electrons in the side wall. Accordingly, the low-concentration impurity region (n− region or p− region) is depleted and the resistance is increased, indicating a degradation mode unique to LDD, which has become a problem. The above problems become noticeable as the channel length is shortened. As a structure to overcome these problems in MOS transistors of 0.5 $\mu$m or less, a GOLD (acronym for gate-overlapped LDD) structure has been invented and employed in which a low-concentration impurity region (n− region or p− region) is formed so as to overlap an end of a gate electrode.

Under these circumstances, employing the LDD structure and the GOLD structure in polycrystalline silicon TFTs fabricated on glass substrates or other transparent insulating substrates is being considered for the purpose of relieving a high electric field near a drain as in the case of MOS transistors. If the LDD structure is employed in a polycrystalline silicon TFT, a low-concentration impurity region (n− region or p− region) functioning as an electric field relieving region is formed in a part of a polycrystalline silicon film that is outside a gate electrode and furthermore high-concentration impurity regions (n+ regions or p+ regions) functioning as a source region and a drain region are formed in parts of the polycrystalline silicon film that are outside the LDD region. While the LDD structure has an advantage of small OFF current, it has a drawback of being less effective in repressing hot carriers by relieving an electric field near a drain. On the other hand, if the GOLD structure is employed, the low-concentration impurity region (n− region or p− region) of the LDD structure is formed so as to overlap an end of a gate electrode and so the effect of repressing hot carriers is larger than the LDD structure. However, the GOLD structure has a drawback of large OFF current.

One of references on n-channel polycrystalline silicon TFTs having a GOLD structure is an article written by Mutuko Hatano, Hajime Akimoto and Takeshi Sakai in "IEDM 97 TECHNICAL DIGEST", 1997, on pages 523 to 526. The article discloses the structure and basic characteristics of a GOLD structure TFT. In the GOLD structure TFT examined in the article, a gate electrode and a side wall for an LDD are formed of polycrystalline silicon, a low-concentration impurity region (n− region) functioning as an electric field relieving region is formed in a part of an active layer (formed of polycrystalline silicon) that is right below the side wall for an LDD, and high-concentration impurity regions (n+ regions) functioning as a source region and a drain region are formed in parts of the active layer that are outside the LDD region. According to the basic characteristics given in the article, the TFT can obtain a large drain current as the drain electric field is relieved and the effect of repressing drain avalanche hot carriers is large compared to ordinary LDD structure TFTs.

A Damascene method used in a process of forming a multi-layer wire for an ultramicro LSI having a design rule of 0.25 $\mu$m or less is an epoch-making technique that can achieve global planarization of a substrate. Since the Damascene method can form a level wire, it is advantageous in terms of reliability problems such as electromigration (EM) and stress migration (SM). Furthermore, the Damascene method is a breakthrough technique capable of solving the problem of shallow penetration of ArF excimer laser reduced projection exposure apparatus that is employed to form an ultramicro pattern.

However, the Damascene method has a problem of unusual scratch defects such as erosion and dishing generated on a surface polished in a CMP process for polishing a thick copper film that has been formed by electroplating. This leads to problems in yield and reliability. Although the scratch defects such as erosion and dishing described above are reduced by improvement of the CMP process, it is far from solving the problem completely. Accordingly, the copper wire forming technique using a Damascene method is not welcome in other processes than a multi-layer wire forming process for an ultramicro LSI having a design rule of 0.25 $\mu$m or less in which planarization in a wire forming process is indispensable and the merit of employing the technique is large. A simple technique of forming a low-resistant wire, which can be employed in the other processes, is therefore needed. The other processes mean single layer wire forming processes for a design rule of 0.25 $\mu$m or more which need to lower the wire resistance. Given as examples thereof are a process of forming a single-layer low-resistant wire in an LSI, and a process of forming a gate electrode and a wire in a semiconductor display device with its circuits built from polycrystalline silicon TFTs.

SUMMARY OF THE INVENTION

The present invention has been made to solve the above-described problems of prior art, and an object of the present invention is therefore to provide a simple technique of forming a low-resistant wire in place of a Damascene method. In other words, an object of the present invention is to provide a semiconductor device obtained by using a simple technique of forming a low-resistant wire in place of a Damascene method as well as a method of manufacturing the semiconductor device.

The following are the major structures of a semiconductor device obtained by using a simple technique of forming a low-resistant wire in place of a Damascene method and a method of manufacturing the semiconductor device.

According to a structure of the present invention, there is provided a semiconductor device, having, on one main face of a substrate, a semiconductor element (and a diffusion preventing film), an interlayer insulating film, and a wire which are layered in order with the semiconductor element the closest to the substrate, the device being characterized in that the wire is composed of a first layer metal film wire of a given measure, a second layer metal film wire, and a low-resistant metal portion, the second layer metal film wire being laid on the first layer metal film wire, the ends of the second layer metal film wire being positioned a certain distance in from the ends of the wire, the low-resistant metal portion being attached to each of left and right side wall portions of the second layer metal film wire.

According to another structure of the present invention, there is provided a method of manufacturing a semiconductor device, characterized by comprising: a step of forming a first layer metal film on a coat by deposition; a step of forming a second layer metal film on the first layer metal film by deposition; a step of forming an insulating film on the second layer metal film by deposition; a step of forming a resist pattern for forming a wire; a step of etching a laminate consisting of the first layer metal film, the second layer metal film, and the insulating film using the resist pattern as a mask to form a laminate wire pattern that has side etching portions in the second layer metal film; a step of removing the resist pattern; and a step of using as a seed portion a metal film wire that consists of the first layer metal film and second layer metal film of the laminate wire pattern, and of forming a low-resistant metal film on an exposed surface of the metal film wire by electroplating to form a laminate wire.

According to another structure of the present invention, there is provided a method of manufacturing a semiconductor device, characterized by comprising: (a step of forming a diffusion preventing film and) a step of forming an interlayer insulating film (on the diffusion preventing film and) on one main face of a substrate on which a plurality of semiconductor elements are arranged; a step of forming a first layer metal film on the interlayer insulating film by deposition; a step of forming a second layer metal film on the first layer metal film by deposition; a step of forming an insulating film on the second layer metal film by deposition; a step of forming a resist pattern for forming a wire; a step of etching a laminate consisting of the first layer metal film, the second layer metal film, and the insulating film using the resist pattern as a mask to form a laminate wire pattern that has side etching portions in the second layer metal film; a step of removing the resist pattern; and an step of using as a seed portion a metal film wire that consists of the first layer metal film and second layer metal film of the laminate wire pattern, and of forming a low-resistant metal film on an exposed surface of the metal film wire by electroplating to form a laminate wire.

In the invention having the above structure, the substrate may be a semiconductor substrate such as a silicon substrate or may be a transparent insulating substrate such as a glass substrate. The semiconductor elements may be MOS transistors or bipolar transistors formed on a semiconductor substrate, or some of them may be MOS transistors whereas the rest are bipolar transistors. Alternatively, the semiconductor elements may be TFTs formed on a transparent insulating substrate.

In the invention having the above structure, the interlayer insulating film is a silicon oxide film, or a silicon oxide film containing phosphorus, or a silicon oxide film containing phosphorus and boron, or an acrylic film, or a polyimide film, or an organic SOG film. The insulating film may be a silicon nitride film, or a silicon oxynitride film, or a silicon oxide film. The first layer metal film wire (or the first layer metal film) comprises one material selected from the group consisting of Ta, TaN, TaSiN, TiN, TiSiN, W, WN, WSiN, WBN, TiW, and IrTa. The second layer metal film wire (or the second layer metal film) is constituted of aluminum or an alloy mainly containing aluminum. A metal smaller in specific resistance than aluminum is suitable for the low-resistant metal portion (or the low-resistant metal film) and, specifically, copper or silver is preferable. The diffusion preventing film is for preventing diffusion of copper or other low-resistant metal elements from the low-resistant metal portion (or the low-resistant metal film). From the standpoint of diffusion preventing function, a silicon nitride film or a silicon oxynitride film is suitable for the diffusion preventing film.

Other than copper and silver, gold is also a metal that is smaller in specific resistance than aluminum. However, the specific resistance of gold is not so small and, coupled with its expensiveness, there is no merit in using gold as a low-resistant metal. Therefore copper and silver are decided as preferable low-resistant metals in the present invention. For reference, specific resistances of aluminum, copper, silver, and gold are included herein. For example, according to "Science Almanac 2000" edited by National Astronomical Observatory of Japan, published by Maruzen Co., Ltd. (p. 482), the specific resistance in a temperature range between 0° C. and 100° C. for aluminum is 2.50 to 3.55 $\mu\Omega$cm. It is 1.55 to 2.23 $\mu\Omega$cm for copper, 1.47 to 2.08 $\mu\Omega$cm for silver, and 2.05 to 2.88 $\mu\Omega$cm for gold.

According to the invention structured as above, the wire (or the laminate wire) is composed of a first layer metal film wire, a second layer metal film wire, and a low-resistant metal portion. The first layer metal film wire has a given measure and is formed of one material selected from the group consisting of Ta, TaN, TaSiN, TiN, TiSiN, W, WN, WSiN, WBN, TiW, and IrTa. The second layer metal film wire is formed of aluminum or an alloy mainly containing aluminum, and is laid on upper layer of the first layer metal film wire. The ends of the second layer metal film wire are positioned a certain distance in from the ends of the wire. The low-resistant metal portion is formed of copper or silver that is a metal element smaller in specific resistance than aluminum, and is attached to each of left and right side wall portions of the second layer metal film wire. Owing to the resistance lowering effect of copper or silver in the low-resistant metal portion, the wire (or the laminate wire) as a whole has an electric resistance lower than that of aluminum.

According to a structure of the present invention, a semiconductor device includes a plurality of thin film transistors formed on one main face of a transparent insulating film, the thin film transistors each having a semiconductor layer, a gate insulating film, and a gate electrode that are layered in order from the semiconductor layer closest to the transparent insulating substrate, the semiconductor layer having a source region, a drain region, and an electric field relieving region, and the semiconductor device is characterized in that:

the gate electrode is composed of a first layer metal film electrode, a second layer metal film electrode, and a low-resistant metal portion, the first layer metal film electrode having a given measure in the channel length direction, the second layer metal film electrode being laid on upper layer of the first layer metal film electrode, the ends of the second layer metal film electrode being positioned a certain distance in from the ends of the electrode, the low-resistant metal portion being attached to each of left and right side wall portions of the second layer metal film electrode;

the source region and the drain region are each formed in a part of the semiconductor layer that is outside the first layer metal film electrode; and the electric field relieving region is formed in a part of the semiconductor layer that is inside the first layer metal film electrode and outside the second layer metal film electrode.

According to a structure of the present invention, a method of manufacturing a semiconductor device is characterized by comprising:

a step of forming a semiconductor layer on a transparent insulating substrate;

a step of forming a gate insulating film by deposition so as to cover the semiconductor layer;

a step of introducing nitrogen as an element to the gate insulating film by heating the gate insulating film in an atmosphere containing a nitrogen component to form a nitrogen-containing gate insulating film;

a step of forming a first layer metal film on the nitrogen-containing gate insulating film by deposition;

a step of forming a second layer metal film on the first layer metal film by deposition;

a step of forming an insulating film on the second layer metal film by deposition;

a step of forming a resist pattern for forming a gate electrode;

a step of etching a laminate consisting of the first layer metal film, the second layer metal film, and the insulating film using the resist pattern as a mask to form a laminate gate electrode pattern that has side etching portions in the second layer metal film;

a step of removing the resist pattern;

a step of forming, by implantation of an impurity element of one conductivity type, a first impurity region in a part of the semiconductor layer that is outside the laminate gate electrode pattern and, at the same time, forming a second impurity region in a part of the semiconductor layer where the first layer metal film is exposed through the second layer metal film in the laminate gate electrode pattern; and a step of using as a seed portion a metal film electrode that consists of the first layer metal film and second layer metal film of the laminate gate electrode pattern, and of forming a low-resistant metal film on an exposed surface of the metal film electrode by electroplating to form a laminate gate electrode.

In the invention having the above structure, a glass substrate or a quartz substrate is given as an example of the transparent insulating substrate. The semiconductor layer may be a polycrystalline silicon film or a crystalline silicon film. In this specification, a polycrystalline silicon film obtained by crystallization utilizing a catalytic element is distinguished from usual polycrystalline silicon films by calling it as a crystalline silicon film. The film is called crystalline instead of polycrystalline since it has crystal grains oriented in roughly the same direction and has high electric field effect mobility compared to usual polycrystalline silicon films. Because of this and other characteristics, the film is distinguished from usual polycrystalline silicon films.

In the invention having the above structure, the gate insulating film is a nitrogen-containing insulating film, specifically, a silicon oxynitride film, obtained by forming a silicon oxide film by deposition and then heating the film in an atmosphere that contains a nitrogen component (nitrogen as a molecule or as an element) to introduce nitrogen as an element into the gate insulating film. By introducing nitrogen as an element into the silicon oxide film, the gate insulating film gains a function of effectively preventing diffusion of copper or other low-resistant metal elements from the low-resistant metal portion (or the low-resistant metal film) provided in the gate electrode (or the laminate gate electrode). The insulating film on the second layer metal film may be a silicon nitride film, or a silicon oxynitride film, or a silicon oxide film.

In the invention having the above structure, the impurity element of one conductivity type is preferably P (phosphorus) that is an n-type impurity or B (boron) that is a p-type impurity. By implanting the impurity element, the first impurity region and the second impurity region are formed at the same time. The first impurity region is a high concentration impurity region that functions as the source region or the drain region. The second impurity region constitutes a low-concentration impurity region that functions as the electric field relieving region. The second impurity region functioning as the electric field relieving region is formed so as to overlap a part of the semiconductor layer that is inside the first layer metal film electrode and outside the second layer metal film electrode, in other words, an end of the gate electrode. This gives the TFT the GOLD structure.

In the invention having the above structure, the first layer metal film electrode (or the first layer metal film) comprises one material selected from the group consisting of Ta, TaN, TaSiN, TiN, TiSiN, W, WN, WSiN, WBN, TiW, and IrTa. The second layer metal film electrode (or the second layer metal film) is constituted of aluminum or an alloy mainly containing aluminum. A metal smaller in specific resistance than aluminum is suitable for the low-resistant metal portion (or the low-resistant metal film), and specifically copper or silver is preferable.

According to the invention structured as above, the gate electrode (or the laminate gate electrode) is composed of a first layer metal film electrode (or a first layer metal film), a second layer metal film electrode (or a second layer metal film), and a low-resistant metal portion (or a low-resistant metal film). The first layer metal film electrode has a given measure in the channel length direction and is formed of one material selected from the group consisting of Ta, TaN, TaSiN, TiN, TiSiN, W, WN, WSiN, WBN, TiW, and IrTa. The second layer metal film electrode is formed of aluminum or an alloy mainly containing aluminum, and is laid on upper layer of the first layer metal film electrode. The ends of the second layer metal film electrode are positioned a certain distance in from the ends of the electrode. The low-resistant metal portion is formed of copper or silver that is a metal element smaller in specific resistance than aluminum, and is attached to each of left and right side wall portions of the second layer metal film electrode. Owing to the resistance lowering effect of copper or silver in the low-resistant metal portion (or the low-resistant metal film), the gate electrode (or the laminate gate electrode) as a whole has an electric resistance lower than that of aluminum. With nitrogen as an element introduced, the gate insulating film can effectively prevent diffusion of copper or silver as an element from the low-resistant metal portion and also is effective in stabilizing electric characteristics of the semiconductor device. The electric field relieving region is placed in the semiconductor layer so as to overlap an end of the gate electrode (or the laminate gate electrode) to give the TFT the GOLD structure. This improves the reliability against hot carriers.

The wire (or laminate wire, or gate electrode, or laminate gate electrode) of the present invention can be formed to have a given measure. There is an appropriate range for the measure of the wire from the viewpoint of electric resistance reducing effect of the low-resistant metal portion and limitations in forming a wire. For the low-resistant metal portion that is attached to each of left and right side walls of the second layer metal film wire (or the second layer metal film electrode), to exert the electric resistance reducing effect, the left and right low-resistant metal portions together have to be ⅓ to ½ of the entire wire. This means that left and right side etching portions formed in the second layer metal film wire (or the second layer metal film electrode) together have to be ⅓ to ½ of the entire wire. In order to form the side etching portions this large by dry etching or wet etching with good accuracy, the estimated measure of side etching portion is approximately 3 μm at maximum for one side alone, approximately 6 μm at maximum for the two sides together. The maximum measure of the side etching portions, 6 μm, is divided by ⅓ to estimate the measure of the entire wire to be roughly 20 μm at maximum. Fine process of a wire pattern with side etching portions taking up ⅓ to ½ of the entire wire is difficult in terms of etching technique, and the limit is considered to be about 0.5 μm. Taking the above points into account, an appropriate range for the measure of the wire of the present invention will be between 0.5 μm and 20 μm.

BRIEF DESCRIPTION OF THE DRAWINGS

In the accompanying drawings:

FIGS. 4A and 4B are sectional views showing a process of manufacturing an active matrix liquid crystal display device;

FIGS. 5A and 5B are sectional views showing a process of manufacturing an active matrix liquid crystal display device;

FIGS. 6A and 6B are sectional views showing a process of manufacturing an active matrix liquid crystal display device;

FIGS. 7A and 7B are sectional views showing a process of manufacturing an active matrix liquid crystal display device;

FIGS. 8A and 8B are sectional views showing a process of manufacturing an active matrix liquid crystal display device;

FIGS. 9A and 9B are sectional views showing a process of manufacturing an active matrix liquid crystal display device;

DETAILED DESCRIPTION OF THE PREFERRED EMBODIMENTS

Figure 1A:
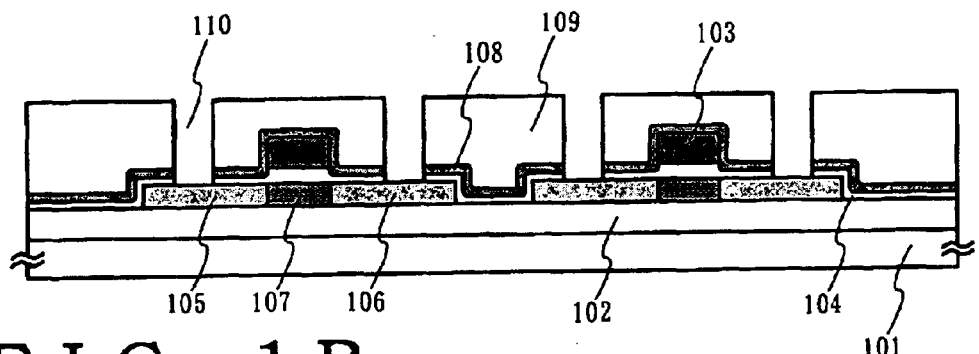
FIGS. 1A to 1D are sectional views showing a process of manufacturing a wire of a TFT.
Figure 1B:
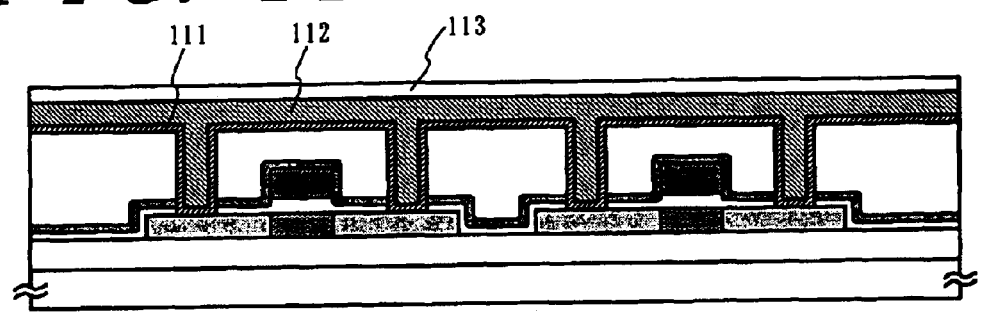
Figure 1C:
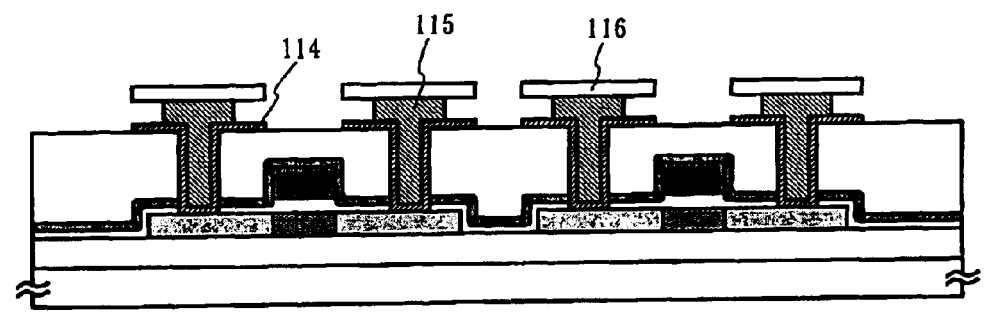
Figure 1D:
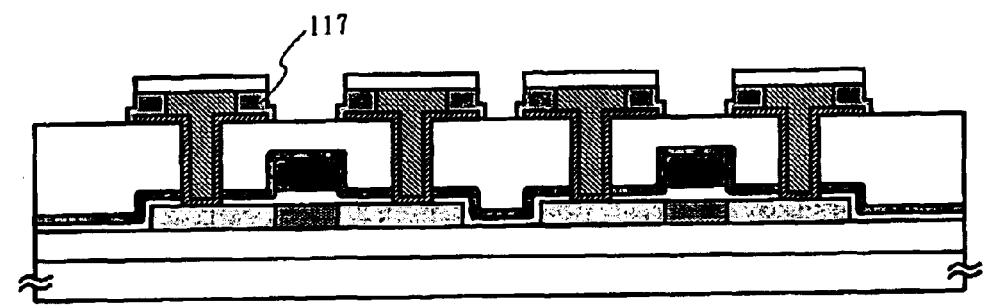
Figure 2A:
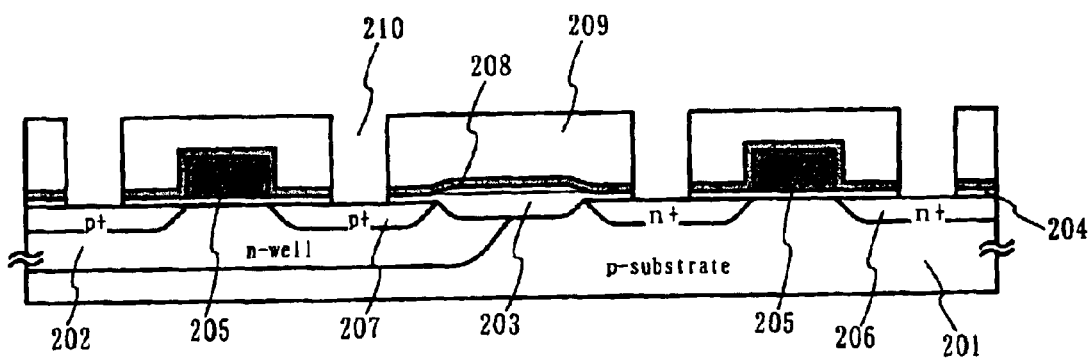
FIGS. 2A to 2D are sectional views showing a process of manufacturing a wire of a CMOS transistor.
Figure 2B:
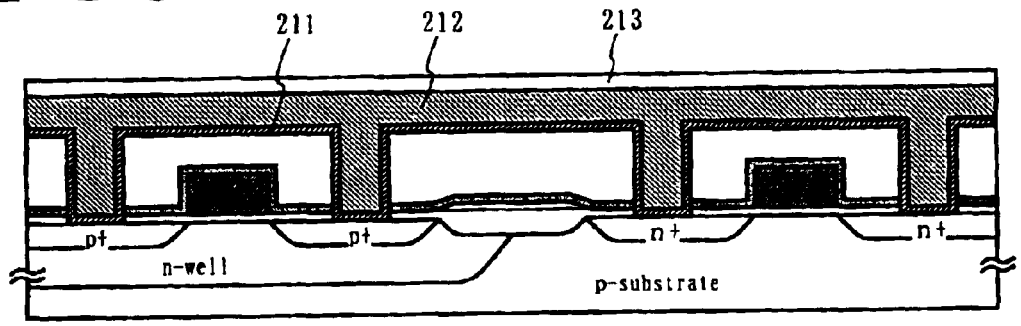
Figure 2C:
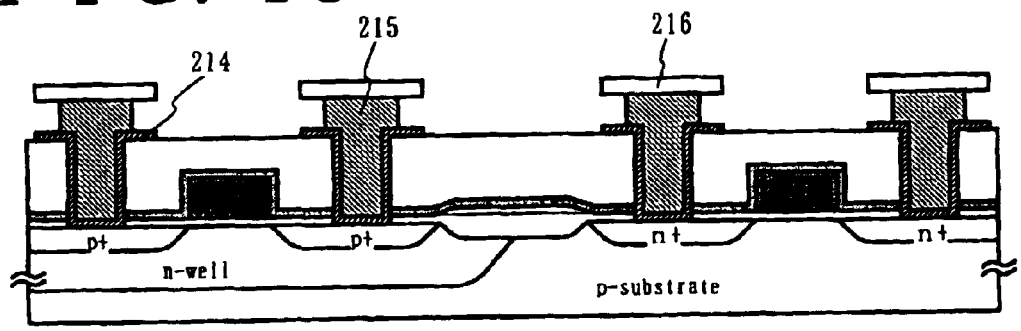
Figure 2D:
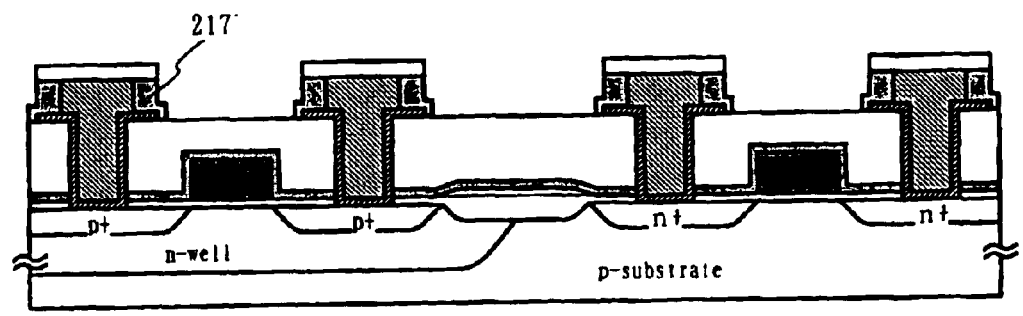
Figure 3A:
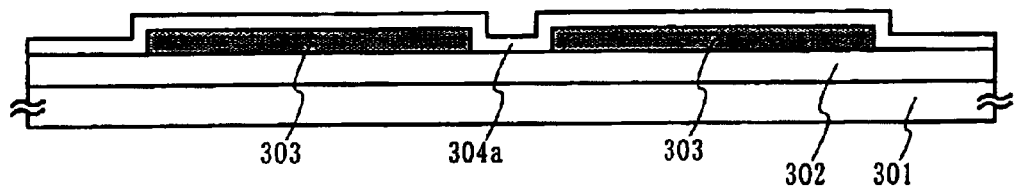
FIGS. 3A to 3E are sectional views showing a process of manufacturing a gate electrode of a TFT.
Figure 3B:
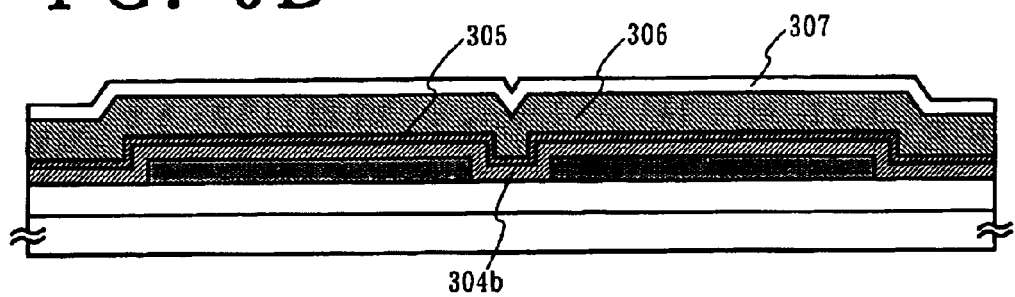
Figure 3C:
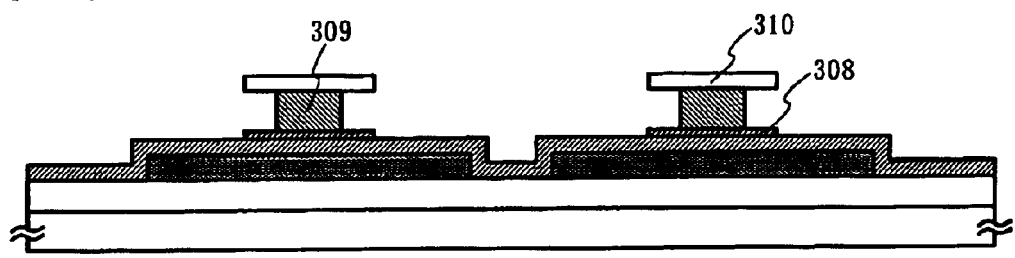
Figure 3D:
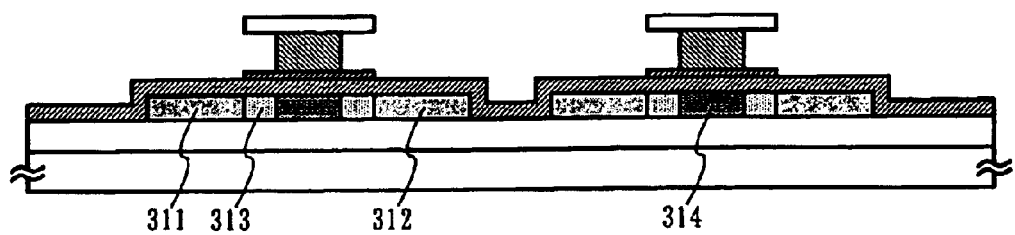
Figure 3E:
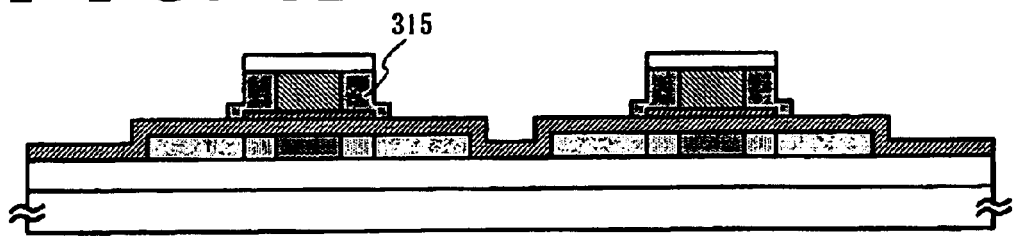
Figure 10A:
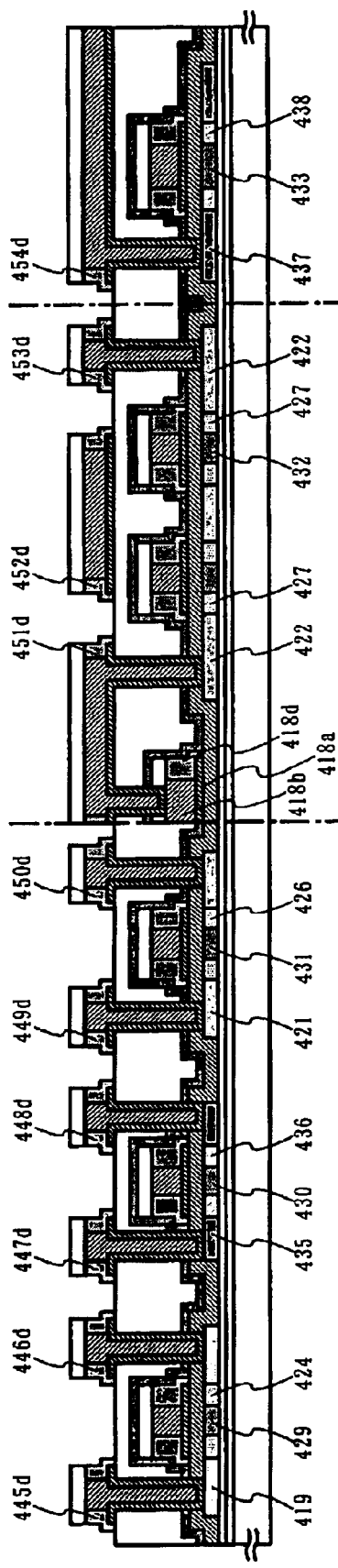
FIGS. 10A and 10B are sectional views showing a process of manufacturing an active matrix liquid crystal display device.
Figure 10B:
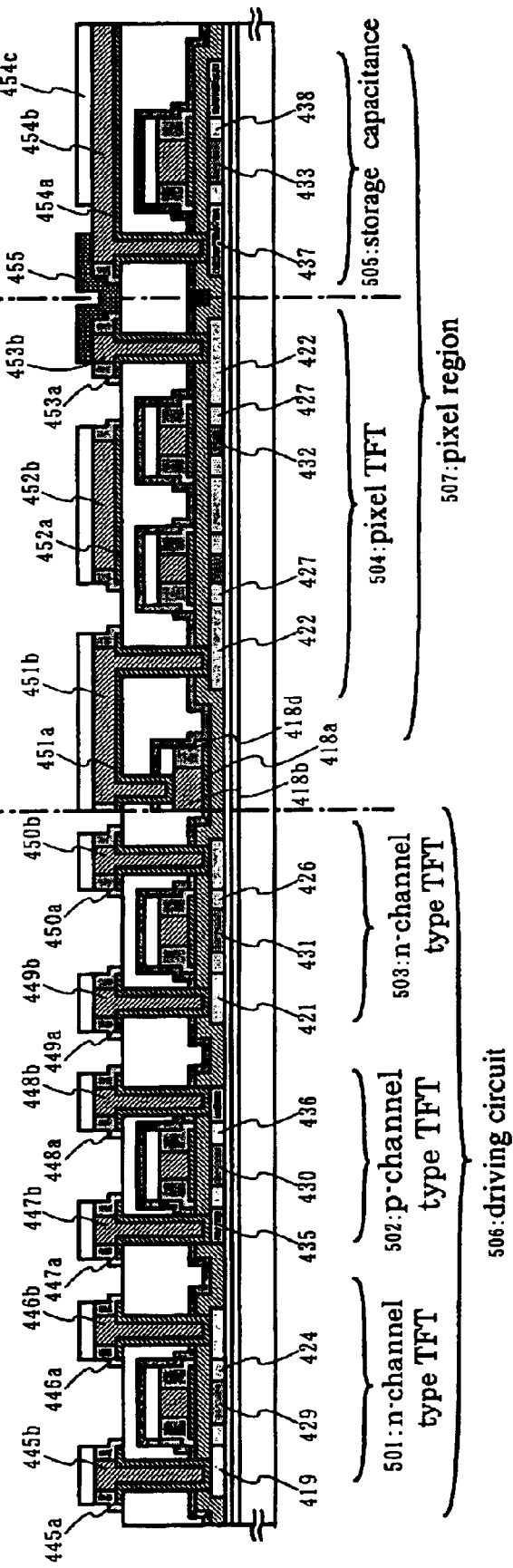

Specific descriptions will be given below on Embodiment Modes of the present invention with reference to manufacture process sectional views of FIGS. 1A to 3E.

Embodiment Mode 1

This embodiment mode describes, as a specific example of a semiconductor device and its manufacture method, a case of applying the present invention to wires that are connected to a source electrode and drain electrode of a TFT on a transparent insulating substrate. The description will be given with reference to FIGS. 1A to 1D.

The structural aspect of the semiconductor device is described first.

According to the basic structure used in this embodiment mode, a base film 102 is formed by deposition on a glass substrate 101 that is a transparent insulating substrate. The base film 102 is a silicon oxynitride film with a given thickness for preventing diffusion of impurity elements from the glass substrate 101. On the base film 102, a TFT is formed as a semiconductor element. The TFT is composed of a gate electrode 103, a gate insulating film 104, and a semiconductor layer. The gate electrode 103 is formed of an aluminum-based alloy or an alloy of a high-melting point metal, and has a given thickness and a given measure. The gate insulating film 104 is a silicon oxide film of a given thickness. The semiconductor layer is a polycrystalline silicon film having a given thickness and a given measure. The semiconductor layer is partitioned into a source region 105 to serve as a source electrode, a drain region 106 to serve as a drain electrode, and a channel region 107. (See FIG. 1A.)

On the substrate where the TFT structured as above is placed, a diffusion preventing film 108 is formed by deposition so as to cover the TFT. The diffusion preventing film is a silicon nitride film or silicon oxynitride film with a thickness of 30 to 100 nm, in this embodiment mode, a silicon nitride film having a thickness of 50 nm. The diffusion preventing film 108 is for preventing diffusion of silver, copper, or other low-resistant metal element from a low-resistant wire described later into the TFT through an interlayer insulating film, and is indispensable to stabilize electric characteristics of the TFT. On the film 108, an interlayer insulating film 109 with a thickness of 500 to 2000 nm is formed to level the substrate. The interlayer insulating film 109 may be an inorganic interlayer insulating film, an organic interlayer insulating film, an organic SOG (abbreviation for Spin-On-glass) film, or the like. The inorganic interlayer insulating film is a silicon oxide film, or a silicon oxide film containing phosphorus (PSG), or a silicon oxide film containing phosphorus and boron (BPSG). The organic interlayer insulating film is an acrylic film or a polyimide film. The organic SOG film is a mixture film of organic and inorganic. The interlayer insulating film 109 in this embodiment mode is an acrylic film formed by spin coating to a thickness of 1000 nm. Alternatively a diffusion preventing film, for example, a silicon nitride film or a silicon oxynitride film, may be formed on the interlayer insulating film 109. Contact holes 110 of a given measure are formed in the diffusion preventing film 108, the interlayer insulating film 109, and the gate insulating film 104 (that has been considerably thinned when the gate electrode 103 is processed by dry etching) in order to electrically connect the source region 105 and drain region 106 of the TFT to wires described later. (See FIG. 1A.)

The wires electrically connected to the source region 105 and drain region 106 of the TFT are placed in the contact holes 110. The wires are characterized in that the electric resistance of the entire wires is lower than the electric resistance of aluminum. As a part of the wire structure, a low-resistant metal portion 117 is formed from copper or silver that is an element smaller in specific resistance than aluminum. Each of the wires is composed of a high-melting point metal-based first layer metal film wire 114, an aluminum-based second layer metal film wire 115, and the low resistant metal portion 117 formed of copper or silver as an element smaller in specific resistance than aluminum. The first layer metal film wire 114 has a given measure. The second layer metal film wire 115 has side etching portions in a certain distance from the ends of the first layer metal film wire 114. The low-resistant metal portion 117 is attached to each of left and right side walls of the second layer metal film wire 115. Here, an insulating film pattern 116 having the same measure as the first layer metal film wire 114 is laid on the second layer metal film wire 115 although the pattern is not a direct structural component of the wire. (See FIGS. 1C and 1D.)

The first layer metal film wire 114 has to have a function of preventing diffusion of copper or silver that is an element constituting the low-resistant metal portion 117 and a function as a seeding portion when the low-resistant metal portion 117 is formed by electroplating that is described later. Materials having these functions are ones used to form a diffusion preventing film for preventing diffusion of copper in a copper (Cu) wire forming technique using a Damascene method (See "Semiconductor World" February 1998, pp. 91–96). A high melting point metal, nitride of high melting point metal, and a compound obtained by doping nitride of a high melting point metal with silicon or boron are suitable materials. For example, Ta, TaN, TaSiN, TiN, TiSiN, W, WN, WSiN, and WBN are suitable for 114. Besides these materials, other preferable materials include TiW and IrTa that are alloys of high melting point metals and other metals. When nitride of a high melting point metal is formed into a film, columnar grain boundaries are often found and diffusion paths might run along the columnar grain boundaries. The diffusion preventing function of the film can be improved by lengthening or blocking the diffusion paths, and this is achieved by doping the nitride of a high melting point metal with silicon or boron. TiSiN, WSiN, and WBN given in the above are specific examples of materials whose diffusion preventing function is improved. The first layer metal film wire 114 formed from one of the above wire materials is a relatively thin film having a thickness of 30 to 200 nm, preferably 50 to 100 nm, and measures 0.5 to 20 μm in length. The first layer metal film wire 114 in this embodiment mode is a TaSiN film having a thickness of 50 nm and a length of 6 μm. (See FIGS. 1C and 1D.) The second layer metal film wire 115 is formed of aluminum or an alloy mainly containing aluminum. The wire 115 is laid on the first layer metal film wire 114 and has side etching portions of a fixed measure. The second layer metal film wire 115 acts as a seed portion for forming the low-resistant metal portion 117 by electroplating described later. The thickness of the second layer metal film wire 115 is 100 to 600 nm, preferably 200 to 500 nm, and the wire 115 has a given measure of 0.5 to 20 μm. In this embodiment mode, the second layer metal film wire 115 is formed of aluminum containing 0.5% of copper to a thickness of 300 nm and measures 3 μm in length. (See FIGS. 1C and 1D.)

The insulating film pattern 116 is an inorganic insulating film such as a silicon nitride film, a silicon oxynitride film, or a silicon oxide film. The insulating film pattern 116 is laid on the second layer metal film wire 115, and has a pattern shape that makes the ends of the wire overlap the ends of the first layer metal film wire 114, in other words, has the same shape as the first layer metal film wire 114. The insulating film pattern 116 is a relatively thin film having a thickness of 30 to 200 nm, preferably 50 to 100 nm, and measures 0.5 to 20 μm in length. In this embodiment mode, the insulating film pattern 116 is a silicon oxynitride film having a thickness of 50 nm and a length of 6 μm. Although any of silicon nitride film, silicon oxynitride film, and silicon oxide film can be used as the material of the insulating film pattern 116, a silicon nitride film or a silicon oxynitride film is preferred in viewpoint of preventing upward diffusion of copper or silver as an element from the low-resistant metal portion 117. (See FIGS. 1C and 1D.)

The low-resistant metal portion 117 is formed by electroplating of copper or silver that is a low-resistant metal element smaller in specific resistance than aluminum while using the first layer metal film wire 114 and the second layer metal film wire 115 as seed portions. The region where 117 is formed is a concave region surrounded by the first layer metal film wire 114, the second layer metal film wire 115, and the insulating film pattern 116. Controlling electrolysis conditions in the electroplating, the low-resistant metal portion 117 is formed to fill up the concave region. When the space in the concave region is completely filled by electrodeposition, the low-resistant metal is deposited to the ends of the first layer metal film wire 114 to some degree, thereby making the wire as a whole slightly larger than the first layer metal film wire 114 in size. In this embodiment mode, copper having a specific resistance of 1.55 to 2.23 μΩcm (temperature range: 0 to 100° C.) is formed into a film by electroplating. (See FIGS. 1C and 1D.)

Next, the embodiment mode will be described from the aspect of manufacture method of the semiconductor device. Since the present invention is about a wire having low resistance, how the TFT is manufactured is omitted from the description.

The TFT is formed on the glass substrate 101 that is a transparent insulating substrate. On the glass substrate 101, silicon nitride or silicon oxynitride is deposited by CVD or sputtering to form a film with a thickness of 30 to 100 nm as the diffusion preventing film 108. The diffusion preventing film 108 in this embodiment mode is a silicon nitride film formed by plasma CVD to a thickness of 50 nm. Next, the interlayer insulating film 109 is formed by CVD, sputtering, or spin coating to a thickness of 0.5 to 2 μm. The interlayer insulating film 109 may be an inorganic interlayer insulating film, or an organic interlayer insulating film, or an organic SOG film. The inorganic interlayer insulating film is a silicon oxide film, or a silicon oxide film containing phosphorus (PSG), or a silicon oxide film containing phosphorus and boron (BPSG). The organic interlayer insulating film is an acrylic film or a polyimide film. The organic SOG film is a mixture film of organic and inorganic. The interlayer insulating film 109 in this embodiment mode is an acrylic film formed by spin coating to a thickness of 1.6 µm. Next, contact holes 110 of a given measure are formed by normal photolithography and dry etching in the diffusion preventing film 108, the interlayer insulating film 109, and the gate insulating film 104 (that has been considerably thinned when the gate electrode 103 is processed by dry etching). (See FIG. 1A.)

A first layer metal film 111 is then formed by normal sputtering, or directional sputtering such as long throw sputtering or ionization sputtering to a thickness of 30 to 200 nm, preferably 50 to 100 nm. A metal-based film selected from the group consisting of a Ta film, a TaN film, a TaSiN film, a TiN film, a TiSiN film, a W film, a WN film, a WSiN film, a WBN film, a TiW film, and an IrTa film is preferred as the material of the first layer metal film 111 considering the function of preventing diffusion from the low-resistant metal portion formed of copper or silver as an element. The first layer metal film 111 in this embodiment mode is a 50 nm thick film formed of TaSiN by long throw sputtering. Next, a second layer metal film 112 is formed from aluminum or an alloy mainly containing aluminum by normal sputtering, or directional sputtering such as long throw sputtering or ionization sputtering to a thickness of 100 to 600 nm, preferably 200 to 500 nm. The second layer metal film 112 in this embodiment mode is formed by long throw sputtering from aluminum containing 0.5% of copper. Formed next as an insulating film 113 by CVD or sputtering is a silicon nitride film, silicon oxynitride film, or silicon oxide film with a thickness of 30 to 200 nm, preferably 50 to 100 nm. The insulating film 113 in this embodiment mode is a silicon oxynitride film formed by plasma CVD to a thickness of 50 nm. (See FIG. 1B.)

Next, a three-layer wire pattern of a given measure is formed by normal photolithography and etching. The wire pattern is composed of the first layer metal film wire 114, second layer metal film wire 115, and insulating film pattern 116 that are layered in order with 114 the closest to the substrate. The first layer metal film wire 114 has a given measure. The second layer metal film wire 115 has side etching portions of a fixed measure. The insulating film pattern 116 is the same size as the first layer metal film wire 114. As has been described, the measure of the wire pattern can be 0.5 to 20 µm. In the wire pattern of this embodiment mode, the first layer metal film wire 114 and the insulating film pattern 116 each measure 6 µm in length and the second layer metal film wire 115 measures 3 µm in length. Specifically, the process includes anisotropic dry etching using a resist pattern (not shown in the drawing) as a mask to form by patterning the insulating film pattern 116 that measures 6 µm in length. The pattern is then subjected to isotropic dry etching or wet etching to form by patterning the second layer metal film wire 115 that has a 1.5 µm long side etching portion on each side. Subsequently, anisotropic dry etching treatment is conducted to form by patterning the first layer metal film wire 114 that measures 6 µm in length. Lastly, the resist pattern (not shown) used as the etching mask is removed. (See FIG. 1C.)

In this process, a terminal electrode (not shown in the drawing) for connection to an external power supply is formed in a specific region of an end of the substrate at the same time the wire pattern is formed. The terminal electrode (not shown) is connected to the wire pattern and fixes the electric potential of the wire pattern to a cathode during the later electroplating.

Next, the first layer metal film wire 114 that is a TaSiN film having a thickness of 50 nm and a length of 6 µm and the second layer metal film wire 115 that is an aluminum film containing 0.5% of copper and having a thickness of 300 nm and a length of 3 µm are used as seed portions, namely, a cathode for electroplating, to thereby form a copper film as the low-resistant metal portion 117. Specifically, the electroplating process includes immersing the substrate in a copper sulfate-based plating solution that is held in a trough. The electroplating is conducted so that concave regions each surrounded by the first layer metal film wire 114, the second layer metal film wire 115, and the insulating film pattern 116 are filled with the metal completely. As pre-treatment of the electroplating, normal photolithography and etching are conducted to remove a part of the insulating film pattern 116 that is laid on the terminal electrode (not shown) formed in a specific region of an end of the substrate. (See FIG. 1D.)

As described above, when the present invention is applied to wires of a semiconductor device that is composed of a plurality of TFTs formed on a transparent insulating substrate, the low-resistant metal portion 117 which is attached to each wire and which is smaller in specific resistance than aluminum can bring the electric resistance of the entire wire considerably lower than that of a wire consisting solely of aluminum. Therefore the present invention is effective in improving the operation speed of the semiconductor device.

Embodiment Mode 2

This embodiment mode describes an example of applying the present invention to wires connected to a source electrode and drain electrode of a CMOS transistor on a semiconductor substrate. The description will be given with reference to FIGS. 2A to 2D. The description in this embodiment mode focuses on the structure of the CMOS transistor, and explanations on the structure and manufacture method of the wires are omitted or simplified to avoid repetition of Embodiment Mode 1.

A semiconductor element is formed on a p type silicon substrate 201 that is a semiconductor substrate. The semiconductor element is a CMOS structure transistor having an NMOS transistor and a PMOS transistor. The NMOS transistor is formed on a p type region and therefore it is not necessary to form a well structure in the p type silicon substrate 201. On the other hand, the PMOS transistor is formed on an n type region. Therefore the PMOS transistor is formed in an n well region 202 where a low concentration of phosphorus (P), an n type impurity, is introduced. The NMOS transistor and the PMOS transistor are separated from each other by a LOCOS (abbreviation for Local Oxidation of Silicon) region 203, which is an element separation region obtained by selective oxidization. (See FIG. 2A.)

The NMOS transistor is composed of a gate electrode 205, a gate insulating film 204, and a source region 206 or a drain region 206. The gate electrode 205 is a polycrystalline silicon film of a given measure and thickness. The gate insulating film 204 is a silicon oxide film of a given thickness. The source region 206 or the drain region 206 is a high-concentration n type impurity region. The PMOS transistor is composed of a gate electrode 205, a gate insulating film 204, and a source region 207 or a drain region 207. The gate electrode 205 is a polycrystalline silicon film of a given measure and thickness. The gate insulating film 204 is a silicon oxide film of a given thickness. The source region 207 or the drain region 207 is a high-concentration p type impurity region formed in the n well region 202. (See FIG. 2A.)

On the substrate where the CMOS transistor structured as above is placed, a diffusion preventing film 208 is formed by deposition so as to cover the CMOS transistor. The diffusion preventing film is a silicon nitride film or silicon oxynitride film with a thickness of 30 to 100 nm, in this embodiment mode, a silicon nitride film having a thickness of 50 nm. The diffusion preventing film 208 is for preventing diffusion of silver, copper, or other low-resistant metal element from a low-resistant wire described later into the CMOS transistor through an interlayer insulating film 209, and is indispensable to stabilize electric characteristics of the CMOS transistor. On the film 208, the interlayer insulating film 209 with a thickness of 0.5 to 2 $\mu$m is formed to level the substrate. The interlayer insulating film 209 may be an inorganic interlayer insulating film, an organic interlayer insulating film, an organic SOG film, or the like. The inorganic interlayer insulating film is a silicon oxide film, or a silicon oxide film containing phosphorus (PSG), or a silicon oxide film containing phosphorus and boron (BPSG). The organic interlayer insulating film is an acrylic film or a polyimide film. The organic SOG film is a mixture film of organic and inorganic. The interlayer insulating film 209 in this embodiment mode is a silicon oxide film containing phosphorus and boron (BPSG) and is formed by normal-pressure CVD to a thickness of 0.7 $\mu$m. The BPSG film receives heat treatment for planarization reflow at a given temperature for a given period of time to obtain a dense, well-leveled film as the interlayer insulating film 209. Alternatively a diffusion preventing film, for example, a silicon nitride film or a silicon oxynitride film, may be formed on the interlayer insulating film 209. Contact holes 210 of a given measure are formed in the interlayer insulating film 209 and the diffusion preventing film 208 as well as the underlying gate insulating film 204 (that has been considerably thinned when the gate electrode 205 is processed by dry etching). Therefore the contact holes 210 electrically connect wires described later to the source region 206 and drain region 206 of the NMOS transistor or the source region 207 and drain region 207 of the PMOS transistor. (See FIG. 2A.)

The wires electrically connected to the source region 206 and drain region 206 of the NMOS transistor or to the source region 207 and drain region 207 of the PMOS transistor are placed in the contact holes 210. The wires are characterized in that the electric resistance of the entire wires is lower than the electric resistance of aluminum. As a part of the wire structure, a low-resistant metal portion 217 is formed from copper or silver that is an element smaller in specific resistivity than aluminum. Each of the wires is composed of a high-melting point metal-based first layer metal film wire 214, an aluminum-based second layer metal film wire 215, and the low-resistant metal portion 217 formed of copper or silver as an element smaller in specific resistance than aluminum. The first layer metal film wire 214 has a given measure. The second layer metal film wire 215 has side etching portions of a fixed measure. The low-resistant metal portion 217 is attached to each of left and right side walls of the second layer metal film wire 215. An insulating film pattern 216 having the same measure as the first layer metal film wire 214 is laid on the second layer metal film wire 215 although the pattern is not a direct structural component of the wire. (See FIGS. 2C and 2D.)

A high melting point metal, nitride of a high melting point metal, and a compound obtained by doping nitride of a high melting point metal with silicon or boron are suitable for the first layer metal film wire 214. Examples thereof include Ta, TaN, TaSiN, TiN, TiSiN, W, WN, WSiN, and WBN. TiW and IrTa that are alloys of high melting point metals and other metals are also preferable for 214. The first layer metal film wire 214 formed from one of the above wire materials is a relatively thin film having a thickness of 30 to 200 nm, preferably 50 to 100 nm, and measures 0.5 to 20 $\mu$m in length. The first layer metal film wire 214 in this embodiment mode is a TaSiN film having a thickness of 50 nm and a length of 2 $\mu$m. (See FIGS. 2C and 2D.)

The second layer metal film wire 215 is formed of aluminum or an alloy mainly containing aluminum. The wire 215 is laid on the first layer metal film wire 214 and has side etching portions of a fixed measure. The thickness of the second layer metal film wire 215 is 100 to 600 nm, preferably 200 to 500 nm, and the wire 215 has a given measure of 0.5 to 20 $\mu$m. In this embodiment mode, the second layer metal film wire 215 is formed of aluminum containing 0.5% of copper to a thickness of 300 nm and measures 1 $\mu$m in length. (See FIGS. 2C and 2D.)

The insulating film pattern 216 is an inorganic insulating film such as a silicon nitride film, a silicon oxynitride film, or a silicon oxide film. The insulating film pattern 216 is laid on the second layer metal film wire 215, and has a pattern shape that makes the ends of the wire overlap the ends of the first layer metal film wire 214, in other words, has the same shape as the first layer metal film wire 214. The insulating film pattern 216 is a relatively thin film having a thickness of 30 to 200 nm, preferably 50 to 100 nm, and measures 0.5 to 20 $\mu$m in length. In this embodiment mode, the insulating film pattern 216 is a silicon oxynitride film having a thickness of 50 nm and a length of 2 $\mu$m. (See FIGS. 2C and 2D.)

The low-resistant metal portion 217 is formed by electroplating of copper or silver that is a low-resistant metal element smaller in specific resistance than aluminum while using the first layer metal film wire 214 and the second layer metal film wire 215 as seed portions. The region where 217 is formed is a concave region surrounded by the first layer metal film wire 214, the second layer metal film wire 215, and the insulating film pattern 216. Controlling electrolysis conditions in the electroplating, the low-resistant metal portion 217 is formed to fill up the concave region. When the space in the concave region is completely filled by electrodeposition, the low-resistant metal is deposited to the ends of the first layer metal film wire 214 to some degree, thereby making the wire as a whole slightly larger than the first layer metal film wire 214 in size. In this embodiment mode, copper having a specific resistance of 1.55 to 2.23 $\mu\Omega$cm (temperature range: 0 to 100° C.) is formed into a film by electroplating. (See FIGS. 2C and 2D.)

As described above, when the present invention is applied to wires of a semiconductor device that is composed of a plurality of MOS transistors formed on a semiconductor substrate, the low-resistant metal portion 217 which is attached to each wire and which is smaller in specific resistance than aluminum can bring the electric resistance of the entire wire considerably lower than that of a wire consisting solely of aluminum. Therefore the present invention is effective in improving the operation speed of the semiconductor device.

Embodiment Mode 3

This embodiment mode is about an example of applying a wire with a low-resistant metal portion attached thereto to a gate electrode of an n-channel TFT. A specific description will be given below with reference to FIGS. 3A to 3E.

The structural aspect of a semiconductor device is described first.

In a semiconductor device of the present invention, a base film 302 is formed by deposition on a glass substrate 301 that is a transparent insulating substrate. The base film 302 is a film with a given thickness for preventing diffusion of impurity elements from the glass substrate 301, specifically a silicon oxynitride film with a thickness of 100 to 200 nm. Formed on the base film 302 is an n-channel TFT with a gate electrode having a low-resistant metal portion 315. The TFT is composed of the gate electrode, a gate insulating film 304*b*, and a semiconductor layer 303. The gate electrode has an electric resistance smaller than that of aluminum. The gate insulating film 304*b* is a silicon oxynitride film of a given thickness. The semiconductor layer 303 is a polycrystalline silicon film having a given thickness and a given measure. The semiconductor layer 303 is partitioned into a source region 311, a drain region 312, an electric field relieving region 313, and a channel region 304. (See FIG. 3C, 3D, and 3E.)

The gate electrode is composed of a high melting point metal-based first layer metal film electrode 308, an aluminum-based second layer metal film electrode 309, and the low-resistant metal portion 315 formed of copper or silver as an element smaller in specific resistance than aluminum. The first layer metal film electrode 308 has a given measure. The second layer metal film electrode 309 has side etching portions of a fixed measure. The low-resistant metal portion 315 is attached to each of left and right of the second layer metal film electrode 309. The gate electrode is characterized in that the electric resistance of the entire gate electrode is lower than the electric resistance of aluminum. An insulating film pattern 310 having the same measure as the first layer metal film electrode 308 is laid on the second layer metal film electrode 309 although the pattern is not a direct structural component of the gate electrode. Detailed descriptions will be given below on the first layer metal film electrode 308, second layer metal film electrode 309, and low-resistant metal film portion 315 that are constituents of the gate electrode, and on the insulating film pattern 310. (See FIGS. 3D and 3E.)

The first layer metal film electrode 308 has to have a function of preventing diffusion of copper or silver that is an element constituting the low-resistant metal portion 315 and a function as a seeding portion when the low-resistant metal portion 315 is formed by electroplating that is described later. Considering this point, a high melting point metal, nitride of a high melting point metal, and a compound obtained by doping nitride of a high melting point metal with silicon or boron are suitable electrode materials. Examples thereof include Ta, TaN, TaSiN, TiN, TiSiN, W, WN, WSiN, and WBN. TiW and IrTa that are alloys of high melting point metals and other metals are also preferable for 308. The first layer metal film electrode 308 formed from one of the above electrode materials is a relatively thin film having a thickness of 30 to 200 nm, preferably 50 to 100 nm, and the appropriate measure range is 0.5 to 20 $\mu$m. The first layer metal film electrode 308 in this embodiment mode is a TaSiN film having a thickness of 50 nm and a length of 4 $\mu$m. (See FIGS. 3D and 3E.)

The second layer metal film electrode 309 is formed of aluminum or an alloy mainly containing aluminum. The electrode 309 is laid on the first layer metal film electrode 308 and has side etching portions of a fixed measure, 3 $\mu$m or less for each of the side etching portions. The second layer metal film electrode 309 acts as a seed portion for forming the low-resistant metal portion 315 by electroplating described later. The thickness of the second layer metal film electrode 309 is 100 to 600 nm, preferably 200 to 400 nm, and the electrode 309 has a given measure of 0.5 to 20 $\mu$m. In this embodiment mode, the second layer metal film electrode 309 is formed of aluminum containing 0.5% of copper to a thickness of 200 nm and measures 2 $\mu$m in length. (See FIGS. 3D and 3E.)

The low-resistant metal portion 315 is formed by electroplating of copper or silver that is a low-resistant metal element smaller in specific resistance than aluminum while using the first layer metal film electrode 308 and the second layer metal film electrode 309 as seed portions. The region where 315 is formed is a concave region surrounded by the first layer metal film electrode 308, the second layer metal film electrode 309, and the insulating film pattern 310. Controlling electrolysis conditions in the electroplating, the low-resistant metal portion 315 is formed to fill up the concave region. When the space in the concave region is completely filled by electrodeposition, the low-resistant metal is deposited to the ends of the first layer metal film electrode 308 to some degree, thereby making the gate electrode as a whole slightly larger than the first layer metal film electrode 308 in size. In this embodiment mode, copper having a specific resistance of 1.55 to 2.23 $\mu\Omega$cm (temperature range: 0 to 100° C.) is formed into a film by electroplating. (See FIGS. 3D and 3E.)

The insulating film pattern 310 is an inorganic insulating film such as a silicon nitride film, a silicon oxynitride film, or a silicon oxide film. The insulating film pattern 310 is laid on the second layer metal film electrode 309, and has a pattern shape that makes the ends of the pattern overlap the ends of the first layer metal film electrode 308, in other words, has the same shape as the first layer metal film electrode 308. The insulating film pattern 310 is a relatively thin film having a thickness of 30 to 200 nm, preferably 50 to 100 nm, and measures 0.5 to 20 $\mu$m in length. In this embodiment mode, the insulating film pattern 310 is a silicon oxynitride film having a thickness of 50 nm and a length of 4 $\mu$m. Although any of silicon nitride film, silicon oxynitride film, and silicon oxide film can be used as the material of the insulating film pattern 310, a silicon nitride film or a silicon oxynitride film is preferred in viewpoint of preventing upward diffusion of copper or silver as an element from the low-resistant metal portion 315. (See FIGS. 3D and 3E.)

Now, other constituents of the TFT than the gate electrode will be described in detail. Under the gate electrode structured as above, a nitrogen-containing gate insulating film with a thickness of 70 to 150 nm is formed as the gate insulating film 304*b*. The gate insulating film 304*b* is a silicon oxynitride film that is a nitrogen-containing gate insulating film. The silicon oxynitride film is obtained by forming a silicon oxide film 304*a* by deposition and then heating the film in an atmosphere containing a nitrogen component at a given temperature for a given period of time. An $N_2O$ atmosphere is suitable as the atmosphere containing a nitrogen component. Alternatively, the heat treatment may be conducted in an $N_2$ atmosphere or $NH_3$ atmosphere. The silicon oxynitride film obtained by heat treatment in an atmosphere containing a nitrogen component is used as the gate insulating film 304*b* because it prevents diffusion of copper or silver as an element from the low-resistant metal portion 315 of the gate electrode positioned on the gate insulating film (see "The Latest Development on Copper Wire Technique", edited by Shozo Ninomiyahara, Nobuyoshi Kuriya, Kazuyoshi Ueno, and Nobuhiro Misawa, published by Realize Co. (SIPEC Corporation), pp. 183–188). It is also to substitute unstable Si—O bond or Si—H bond in the interface of the silicon oxide film with a more stable atom to reduce fluctuation in characteristic which is caused by trapped charges in the interface. The gate insulating film 304*b* in this embodiment mode is a 100 nm thick silicon oxynitride film obtained by heating a silicon oxide film in an N$_2$O atmosphere at a given temperature. (See FIG. 3B.)

Under the gate insulating film 304b, a polycrystalline silicon film of a given thickness and given measure is placed as the semiconductor layer 303. The semiconductor layer 303 in this embodiment mode is a polycrystalline silicon film with a thickness of 50 nm, and has a given measure. The semiconductor layer 303 is divided into the source region 311, the drain region 312, the electric field relieving region 313, and the channel region 314 by the kind and amount of impurity contained. The source region 311 and the drain region 312 are regions in which a high concentration of phosphorus (P) that is an n type impurity is implanted. The regions 311 and 312 are outside the first layer metal film electrode 308. The electric field relieving region 313 is to counter hot carriers by relieving an electric field in the channel horizontal direction. The region 313 is formed such that a low-concentration impurity region doped with phosphorus (P) that is an n type impurity overlaps an end of the gate electrode, in other words, a region that is inside the first layer metal film electrode 308 of the gate electrode and outside the second layer metal film electrode 309. The channel region 314 is positioned right under the second layer metal film electrode 309 of the gate electrode. Usually, the channel region 314 receives channel doping for controlling threshold. In this embodiment mode, boron (B) is implanted in the channel region 314 to give the region a boron concentration of about $1 \times 10^{17}$ atoms/cm$^3$ and to make the n-channel TFT an enhancement type TFT. (See FIG. 3D.)

Next, the embodiment mode will be described from the aspect of manufacture method of the semiconductor device. The base film 302 is formed on the glass substrate 301 that is a transparent insulating substrate in order to prevent diffusion of an impurity from the glass substrate 301. The base film 302 is a silicon oxynitride film formed by CVD or sputtering to a thickness of 100 to 200 nm. In this embodiment mode, the base film 302 is a silicon oxynitride film formed by plasma CVD to a thickness of 150 nm. Thereafter, an amorphous silicon film is formed by plasma CVD or reduced pressure CVD to a thickness of 53 nm and is subjected to heat treatment to form a polycrystalline silicon film with a thickness of 50 nm. Heat treatment of the amorphous silicon film may be heating in a furnace at 600° C. for about 24 hours, or laser crystallization at a laser power of 200 mJ/cm$^2$ or higher, or a combination of heating in a furnace and laser crystallization. (See FIG. 3A.)

Next, channel doping is conducted using ion doping apparatus to control the threshold voltage of the n-channel TFT. The channel doping is for making the n-channel TFT an enhancement type TFT and is achieved by implanting a small dose of p type impurity (specifically, boron (B)) throughout the substrate. In this embodiment mode, boron in a dose of $5 \times 10^{11}$ ions/cm$^2$ (the dose is for boron alone) is implanted at an acceleration voltage of 15 kV to give the semiconductor layer 303 that is a 50 nm thick polycrystalline silicon film a boron concentration of $1 \times 10^{17}$ atoms/cm$^3$. The semiconductor layer 303 is then patterned by normal photolithography and dry etching to obtain a given pattern shape and a given measure. After the patterning, the silicon oxide film 304a having a thickness of 70 to 150 nm is formed by plasma CVD or reduced pressure CVD so as to cover the semiconductor layer 303. The silicon oxide film 304a in this embodiment mode is formed by plasma CVD to a thickness of 100 nm. (See FIG. 3A.)

Next, a silicon oxynitride film with a thickness of 100 nm is formed as the gate insulating film 304b by heating the silicon oxide film 304a in a furnace in an atmosphere containing a nitrogen component at a given temperature for a given period of time. Here, the silicon oxide film 304a is transformed into the silicon oxynitride film because it prevents diffusion of copper or silver as an element from the low-resistant metal portion 315 of the gate electrode described later. It is also to substitute unstable Si—O bond or Si—H bond in the interface of the silicon oxide film with a more stable atom to reduce fluctuation in characteristic which is caused by trapped charges in the interface. The gate insulating film 304b in this embodiment mode is a 100 nm thick silicon oxynitride film obtained by heating the silicon oxide film in an N$_2$O atmosphere that is chosen as an atmosphere containing a nitrogen component. (See FIG. 3B.)

Then a first layer metal film 305 is formed by normal sputtering to a thickness of 30 to 200 nm, preferably 50 to 100 nm. A metal-based film selected from the group consisting of a Ta film, a TaN film, a TaSiN film, a TiN film, a TiSiN film, a W film, a WN film, a WSiN film, a WBN film, a TiW film, and an IrTa film is preferred as the material of the first layer metal film 305 considering the function of preventing diffusion from the low-resistant metal portion 315, which is formed of copper or silver as an element and is described later. The first layer metal film 305 in this embodiment mode is a 50 nm thick film formed of TaSiN by sputtering. Next, a second layer metal film 306 is formed from aluminum or an alloy mainly containing aluminum by normal sputtering to a thickness of 100 to 600 nm, preferably 200 to 500 nm. The second layer metal film 306 in this embodiment mode is formed by sputtering from aluminum containing 0.5% of copper to a thickness of 200 nm. Formed next as an insulating film 307 by CVD or sputtering is a silicon nitride film, silicon oxynitride film, or silicon oxide film with a thickness of 30 to 200 nm, preferably 50 to 100 nm. The insulating film 307 in this embodiment mode is a silicon oxynitride film formed by plasma CVD to a thickness of 50 nm. (See FIG. 3B.)

Next, a three-layer gate electrode pattern of a given measure is formed by normal photolithography and etching. The gate electrode pattern is composed of the first layer metal film electrode 308, second layer metal film electrode 309, and insulating film pattern 310 that are layered in order with 308 the closest to the substrate. The first layer metal film electrode 308 has a given measure. The second layer metal film electrode 309 has side etching portions of a fixed measure. The insulating film pattern 310 is the same size as the first layer metal film electrode 308. As has been described, the measure of the gate electrode pattern can be 0.5 to 20 $\mu$m. In the gate electrode pattern of this embodiment mode, the first layer metal film electrode 308 and the insulating film pattern 310 each measure 4 $\mu$m in length and the second layer metal film electrode 309 measures 2 $\mu$m in length. Specifically, the process includes anisotropic dry etching using a resist pattern (not shown in the drawing) as a mask to form by patterning the insulating film pattern 310 that measures 4 $\mu$m in length. The pattern is then subjected to isotropic dry etching or wet etching to form by patterning the 2 $\mu$m long second layer metal film electrode 309 that has a 1 $\mu$m long side etching portion on each side. Subsequently, anisotropic dry etching is conducted to form by patterning the first layer metal film electrode 308 that measures 4 $\mu$m in length. Lastly, the resist pattern (not shown) used as the etching mask is removed. (See FIG. 3C.)

In this patterning step, a terminal electrode (not shown in the drawing) for connection to an external power supply is formed in a specific region of an end of the substrate at the same time the gate electrode pattern is formed. The terminal electrode (not shown) is connected to the gate electrode pattern and fixes the electric potential of the gate electrode that is composed of the first layer metal film electrode 308 and the second layer metal film electrode 309 to a certain minus electric potential during electroplating described later.

Next, ion doping apparatus is used to implant a large dose of n type impurity, phosphorus (P) and form first impurity regions that serve as the source region 311 and the drain region 312 and a second impurity region that serves as the electric field relieving region 313. The first impurity regions to serve as the source region 311 and the drain region 312 are high-concentration n type impurity regions (n+ regions) formed in portions of the semiconductor layer 303 that are outside the first layer metal film electrode 308. The second impurity region to serve as the electric field relieving region 313 is a low-concentration n type impurity region (n– region) formed so as to overlap an end of the gate electrode, in a part of the semiconductor layer 303 that is inside the first layer metal film electrode 308 and outside the second layer metal film electrode 309, to be exact. The doping conditions in this step include setting the acceleration voltage to 70 to 100 kV and the dose to $2 \times 10^{15}$ to $6 \times 10^{15}$ ions/cm$^2$. In this embodiment mode, the doping conditions for implanting the impurity are to set the acceleration voltage to 100 kV and to set the dose to $4 \times 10^{15}$ ions/cm$^2$. (See FIG. 3D.)

Next, the first layer metal film electrode 308 that is a TaSiN film having a thickness of 50 nm and a length of 4 μm and the second layer metal film electrode 309 that is an aluminum film containing 0.5% of copper and having a thickness of 200 nm and a length of 2 μm are used as seed portions for electroplating, to thereby form a copper film as the low-resistant metal portion 315. Specifically, the electroplating process includes immersing the substrate in a copper sulfate-based plating solution that is held in a trough. The electroplating is conducted so that concave regions each surrounded by the first layer metal film electrode 308, the second layer metal film electrode 309, and the insulating film pattern 310 are filled with the metal completely. As pre-treatment of the electroplating, normal photolithography and etching are conducted to remove a part of the insulating film pattern 307 that is laid on the terminal electrode (not shown) formed in a specific region of an end of the substrate. (See FIG. 3E.)

As described above, when the present invention is applied to gate electrodes of a semiconductor device that is composed of a plurality of TFTs formed on a transparent insulating substrate, the low-resistant metal portion 315 which is attached to each gate electrode and which is smaller in specific resistance than aluminum can bring the electric resistance of the entire gate electrode considerably lower than that of a gate electrode consisting solely of aluminum. Therefore the present invention is effective in improving the operation speed of the semiconductor device. In addition, the present invention effectively prevents diffusion of copper or silver as an element from the low-resistant metal portion 315 into the semiconductor layer 303 and is also effective against fluctuation in characteristic which is a problem caused by trapped charges in a silicon oxide film because a silicon oxynitride film obtained by heat treatment in an atmosphere that contains a nitrogen component is used as the gate insulating film 304b. Moreover, the semiconductor device is improved in reliability against hot carriers since the device has a GOLD structure in which the electric field relieving region 313 is at an end of the gate electrode.

Embodiment 1

This embodiment gives with reference to FIGS. 4A to 10B a specific description on a method of manufacturing an active matrix liquid crystal display device employing a gate electrode and a wire of the present invention. In this embodiment, a crystalline silicon film crystallized by utilizing a catalytic element is used for a semiconductor layer that serves as an active layer of a TFT instead of a usual polycrystalline silicon film.

First, a first layer silicon oxynitride film 402a with a thickness of 50 nm and a second layer silicon oxynitride film 402b with a thickness of 100 nm are formed by plasma CVD on a glass substrate 401. The films 402a and 402 have different composition ratios and together make a base film 402. The glass substrate 401 used here is formed of quartz glass, barium borosilicate glass, or alumino borosilicate glass. On the base film 402 (402a and 402b), an amorphous silicon film 403a is formed by plasma CVD to a thickness of 53 nm. During the deposition, a very thin natural oxide film (not shown in the drawing) is formed on the surface of the amorphous silicon film 403a due to oxygen in the air mixed in the treatment atmosphere. Although this embodiment uses plasma CVD to form the amorphous silicon film 403a, reduced pressure CVD may be used instead. (See FIG. 4A.)

When forming the amorphous silicon film 403a by deposition, carbon, oxygen, and nitrogen in the air might be mixed in the film. These impurity gas mixed in are empirically known to cause degradation of the final TFT characteristics, and contamination by the impurity gas supposedly inhibits crystallization. Therefore mixing-in of the impurity gas should be avoided thoroughly. Specifically, it is preferable that the impurity content in the film is controlled so that carbon and nitrogen are each $5 \times 10^{17}$ atoms/cm$^3$ or less and oxygen is $1 \times 10^{18}$ atoms/cm$^3$ or less. (See FIG. 4A.)

Next, the substrate is washed with diluted fluoric acid for a given period of time to remove the natural oxide film (not shown) formed on the surface of the amorphous silicon film 403a. Thereafter the surface of the amorphous silicon film 403a is lightly oxidized by ozone water treatment for a given period of time. Through the light oxidization, a clean silicon oxide film (not shown in the drawing) which is very thin is formed on the surface of the amorphous silicon film 403a. Instead, the very thin silicon oxide film (not shown) may be formed by treatment using hydrogen peroxide water. The very thin silicon oxide film (not shown) is provided to improve uniform adhesion of nickel (Ni) to the amorphous silicon film 403a when a nickel (Ni) aqueous solution is later applied by spin coating as a solution containing a catalytic element (hereinafter abbreviated as a catalytic element solution). (See FIG. 4A.)

Next, a nickel (Ni) aqueous solution as a catalytic element solution having an effect of accelerating crystallization is applied by spin coating to the entire surface of the amorphous silicon film 403a (strictly speaking, the very thin silicon oxide film). In this embodiment, the nickel (Ni) aqueous solution is prepared by dissolving nickel acetate that is a Ni compound in pure water with the Ni concentration adjusted to 10 ppm by weight. A Ni-containing layer (not shown in the drawing) is thus uniformly adhered to the entire surface of the amorphous silicon film 403a (strictly speaking, the very thin silicon oxide film). (See FIG. 4A.)

Next, hydrogen contained in the amorphous silicon film 403a is reduced by dehydrogenation in order to make the hydrogen content in the amorphous silicon film 403a 5 atom % or less. The dehydrogenation is achieved by heat treatment in a nitrogen atmosphere at 450° C. for an hour using a furnace. Thereafter, heat treatment is conducted in a furnace at 550° C. for four hours to accelerate crystallization of the amorphous silicon film 403a and obtain a crystalline silicon film 403b 50 nm in thickness. Subsequently, the crystallinity of the obtained crystalline silicon film 403b is further improved by irradiation of a pulse oscillation type KrF excimer laser (wavelength: 248 nm). In this specification, a polycrystalline silicon film obtained by crystallization utilizing Ni that is a catalytic element is distinguished from usual polycrystalline silicon films by calling it as a crystalline silicon film. The film is called crystalline instead of polycrystalline since it has crystal grains oriented in roughly the same direction and has high field effect mobility and the like compared to usual polycrystalline silicon films. Because of this and other characteristics, the film is distinguished from usual polycrystalline silicon films. (See FIG. 4B.)

The next step is pre-channel doping washing, namely, washing with diluted fluoric acid and washing with ozone water for a given period of time to form a very thin silicon oxide film (not shown in the drawing) on the surface of the crystalline silicon film 403b. The very thin silicon oxide film (not shown) is to prevent hydrogen ions (generated from a mixture gas of hydrogen and diborane ($B_2H_6$) as an ion source) from etching the crystalline silicon film 403b during channel doping. After that, channel doping as the first doping treatment is conducted using ion doping apparatus in order to control the threshold voltage of an n-channel TFT and a p-channel TFT. The channel doping is achieved by implanting a small dose of p type impurity (specifically, boron (B)) throughout the substrate. In this embodiment, boron in a dose of $5\times10^{11}$ ions/cm$^2$ (the dose is for boron alone) is implanted at an acceleration voltage of 15 kV to give semiconductor layers 404 to 408 that are 50 nm thick crystalline silicon films a boron concentration of $1\times10^{17}$ atoms/cm$^3$. (See FIG. 4B.)

The crystalline silicon film 403b is then patterned by normal photolithography and dry etching to obtain the semiconductor layers 404 to 408 each having a given pattern shape and a given measure. The semiconductor layers 404 to 408 function as source regions, drain regions, and channel regions of TFTs. (See FIG. 5A.)

Next, a silicon oxide film having a thickness of 70 to 150 nm is formed by plasma CVD or reduced pressure CVD so as to cover the semiconductor layers 404 to 408. The silicon oxide film in this embodiment is formed by plasma CVD to a thickness of 100 nm. Subsequently, the silicon oxide film receives heat treatment in a furnace in an atmosphere containing a nitrogen component at a given temperature for a given period of time to form a silicon oxynitride film with a thickness of 100 nm as a gate insulating film 409. Here, the silicon oxide film is transformed into the silicon oxynitride film because it prevents diffusion of copper or silver as an element from low-resistant metal portions 413d to 418d of gate electrodes and others described later into the semiconductor layers 404 to 408. It is also to substitute unstable Si—O bond or Si—H bond in the interface of the silicon oxide film with a more stable atom to reduce fluctuation in characteristic which is caused by trapped charges in the interface. The gate insulating film 409 in this embodiment is a 100 nm thick silicon oxynitride film obtained by heating a silicon oxide film in an $N_2O$ atmosphere that is chosen as an atmosphere containing a nitrogen component. (See FIG. 5B.)

Then a first layer metal film 410, a second layer metal film 411, and an insulating film 412 are formed in succession by deposition to obtain a laminate for gate electrodes. To elaborate, the first layer metal film 410 is formed by normal sputtering to a thickness of 30 to 200 nm, preferably 50 to 100 nm. A metal-based film selected from the group consisting of a Ta film, a TaN film, a TaSiN film, a TiN film, a TiSiN film, a W film, a WN film, a WSiN film, a WBN film, a TiW film, and an IrTa film is preferred as the material of the first layer metal film 410 considering the function of preventing diffusion from the low-resistant metal portions 413d to 418d, which are formed of copper or silver as an element and described later. The first layer metal film 410 in this embodiment is a 30 nm thick film formed of TaSiN by sputtering. The second layer metal film 411 is formed from aluminum or an alloy mainly containing aluminum by normal sputtering to a thickness of 100 to 600 nm, preferably 200 to 500 nm. The second layer metal film 411 in this embodiment is formed by sputtering from aluminum containing 0.5% of copper to a thickness of 200 nm. The insulating film 412 is a silicon nitride film, silicon oxynitride film, or silicon oxide film formed by CVD or sputtering to a thickness of 30 to 200 nm, preferably 50 to 100 nm. The insulating film 412 in this embodiment is a silicon oxynitride film formed by plasma CVD to a thickness of 50 nm. (See FIG. 5B.)

Next, three-layer gate electrode patterns 413abc (413a, 413b, and 413c) to 416abc of a given measure are formed by normal photolithography and etching. At the same time, capacitor storage electrode patterns 417abc and source wire electrode patterns 418abc functioning as source wires are formed. The gate electrode patterns 413abc to 416abc are composed of the first layer metal film electrodes 413a to 416a, second layer metal film electrodes 413b to 416b, and insulating film patterns 413c to 416c which are layered in order with the first layer metal film electrodes the closest to the substrate. The first layer metal film electrodes 413a to 416a each have a given measure. The second layer metal film electrodes 413b to 416b each have side etching portions of a fixed measure. The insulating film patterns 413c to 416c each have the same size as each of the first layer metal film electrodes 413a to 416a. The measure of the gate electrode patterns can be about 0.5 to 20 μm. In the gate electrode patterns of this embodiment, the first layer metal film electrodes 413a to 416a and the insulating film patterns 413c to 416c each measure 4 μm in length and the second layer metal film electrodes 413b to 416b each measure 2 μm in length. Specifically, the process includes anisotropic dry etching using a resist pattern (not shown in the drawing) as a mask to form by patterning the insulating film patterns 413c to 416c each measuring 4 μm in length. The patterns are then subjected to isotropic dry etching or wet etching to form by patterning the 2 μm long second layer metal film electrodes 413b to 416b each having a 1 μm long side etching portion on each side. Subsequently, anisotropic dry etching is conducted to form by patterning the first layer metal film electrodes 413a to 416a each measuring 4 μm in length. Lastly, the resist pattern (not shown) used as the etching mask is removed. (See FIG. 6A.)

The storage capacitor electrode patterns 417abc and the source wire electrode patterns 418abc also receive similar patterning process. In this patterning process, a terminal electrode (not shown in the drawing) for connection to an external power supply is formed in a specific region of an end of the substrate at the same time the gate electrode patterns 413abc to 416abc, the storage capacitor electrode patterns 417abc, and the source wire electrode patterns 418abc are formed. The terminal electrode (not shown) is connected to the gate electrode patterns 413abc to 416abc and others and fixes the electric potential of the gate electrode patterns 413abc to 416abc and others to a certain minus electric potential during electroplating described later. (See FIG. 6A.)

Next, ion doping apparatus is used to implant a large dose of n type impurity, phosphorus (P), as the second doping treatment. The gate electrode patterns 413abc to 416abc and the capacitor storage electrode patterns 417abc are used as masks in the second doping treatment, through which first impurity regions 419 to 422 are formed in regions of the semiconductor layers 404 to 407 that are outside the first layer metal film electrodes 413a to 416a of the gate electrodes. The first impurity regions 419 to 422 are high-concentration n type impurity regions (n+ regions) that function as source regions and drain regions. At the same time, second impurity regions 424 to 427 are formed in regions of the semiconductor layers 404 to 407 that are inside the first layer metal film electrodes 413a to 416a of the gate electrode patterns 413abc to 416abc and outside the second layer metal film electrodes 413b to 416b. The second impurity regions 424 to 427 are low-concentration n type impurity regions (n− regions) that function as electric field relieving regions. In the semiconductor layer 408 where the capacitor storage electrode patterns 417abc are formed, since 408 is not for forming a TFT but for forming a capacitor storage 505, first impurity regions 423 and second impurity regions 428 are similarly formed side by side. The first impurity regions 423 are high-concentration n type impurity regions (n+ regions) that function as one of capacitor electrodes. The second impurity regions 428 are low-concentration n type impurity regions (n− regions). The doping conditions in this step include setting the acceleration voltage to 70 to 100 kV and the dose to $2\times10^{15}$ to $6\times10^{15}$ ions/cm². In this embodiment, the doping conditions for implanting the impurity are to set the acceleration voltage to 100 kV and to set the dose to $4\times10^{15}$ ions/cm². (See FIG. 6B.)

As the first impurity regions 419 to 423 and the second impurity regions 424 to 428 are formed, channel regions 429 to 432 of TFTs are defined in regions of the semiconductor layers 404 to 407 that overlap the second layer metal film electrodes 413b to 416b of the gate electrode patterns 413abc to 416abc. A region 433 functioning as one of the capacitor forming electrodes is also defined in a region of the semiconductor layer 408 that overlaps the second layer metal film electrode 417b of the capacitor storage electrode patterns 417abc. (See FIG. 6B.)

Next, a resist pattern 434 is formed by normal photolithography. The resist pattern 434 has openings in positions corresponding to the semiconductor layers 405 and 408 for forming a p-channel TFT 502 and a capacitor storage 505. Using the resist pattern 434 as a mask, a large dose of p type impurity, boron (B), is implanted as the third doping treatment by using ion doping apparatus. Through the third doping treatment, third impurity regions 435 are formed in regions of the semiconductor layer 405 that are outside the first layer metal film electrode 414a of the gate electrode patterns 414abc. The third impurity regions 435 are high-concentration p type impurity regions (p+ regions) that function as a source region and a drain region. At the same time, fourth impurity regions 436 are formed in regions of the semiconductor layer 405 that are inside the first layer metal film electrode 414a of the gate electrode patterns 414abc and outside the second layer metal film electrode 414b. The fourth impurity regions 436 are low-concentration p type impurity regions (p− regions) that function as electric field relieving regions. In the semiconductor layer 408 where the capacitor storage electrode patterns 417abc are formed, third impurity regions 437 and fourth impurity regions 438 are similarly formed side by side. The third impurity regions 437 are high-concentration p type impurity regions (p+ regions) that function as one of capacitor forming electrodes. The fourth impurity regions 438 are low-concentration p type impurity regions (p− regions). Phosphorus (P) that is an n type impurity is already implanted in the third impurity regions 435 and 437 and the fourth impurity regions 436 and 438. However, the final conductivity of these regions is p type since boron as a p type impurity is implanted in a dose larger than the dose of phosphorus. The doping conditions in this step include setting the acceleration voltage to 70 to 100 kV and the dose to $5\times10^{15}$ to $1.5\times10^{16}$ ions/cm². In this embodiment, the doping conditions for implanting the impurity are to set the acceleration voltage to 100 kV and to set the dose to $1\times10^{16}$ ions/cm². (See FIG. 7A.)

The resist pattern 434 used as a mask in the third doping treatment is removed and then the first electroplating is conducted. The first electroplating uses as seed portions the first layer metal film electrodes 413a to 418a that are 30 nm thick TaSiN films and the second layer metal film electrodes 413b to 418b that are 200 nm thick aluminum films containing 0.5% of copper in the gate electrode patterns 413abc to 416abc, the capacitor storage electrode patterns 417abc, and the source wire electrode patterns 418abc. Through the first electroplating, the low-resistant metal portions 413d to 418d are formed from copper or silver as an element. In forming 413d to 418d, concave regions surrounded by the first layer metal film electrodes 413a to 418a, the second layer metal film electrodes 413b to 418b, and the insulating film patterns 413c to 418c are completely filled and the first layer metal film electrodes 413a to 418a are slightly covered with 413d to 418d. In this embodiment, the substrate is immersed in a copper sulfate-based plating solution that is held in a trough to form copper having a specific resistance of 1.55 to 2.23 $\mu\Omega$cm (temperature range: 0 to 100° C.) into a film. Thus formed are gate electrodes 413abd (413a, 413b, and 413d) to 416abd, capacitor storage electrodes 417abd, and source wire electrodes 418abd. As pre-treatment of the electroplating, normal photolithography and etching are conducted to remove a part of the insulating film 412 that is laid on the terminal electrode (not shown) formed in a specific region of an end of the substrate. (See FIG. 7B.)

Next, a diffusion preventing film 439 is formed by CVD or sputtering. The film 439 is a first interlayer insulating film that is a silicon nitride film or silicon oxynitride film with a thickness of about 30 to 100 nm. The diffusion preventing film 439 is for preventing diffusion of copper, silver, or other low-resistant metal element from low-resistant wires described later through an interlayer insulating film that is formed on the diffusion preventing film 439. In this embodiment, a silicon nitride film is formed as the diffusion preventing film 439 by plasma CVD to a thickness of 100 nm. Thereafter, heat treatment is conducted in a furnace at 600° C. for 12 hours for thermal activation of the n type impurity (phosphorus) or p type impurity (boron) implanted in the semiconductor layers 404 to 408. The heat treatment is for thermal activation of the n type or p type impurities, and doubles as gettering of nickel (Ni) that is the catalytic element in the channel regions 429 to 432 of n-channel TFTs 501, 503, and 504, and in the p-channel TFT 502 using the impurity. The thermal activation may precede formation of the diffusion preventing film 439 by deposition, but it is preferred to conduct the thermal activation after the diffusion preventing film 439 is formed by deposition if wire materials of gate electrodes and others have poor heat resistance. Thereafter the substrate is subjected to hydrogenation at 410° C. for an hour in a nitrogen atmosphere containing 3% of hydrogen in order to terminate dangling bonds of the semiconductor layers 404 to 408. (See FIG. 8A.)

On the diffusion preventing film 439 that is the first interlayer insulating film, a second interlayer insulating film (hereinafter abbreviated as interlayer insulating film) is formed. The interlayer insulating film may be an inorganic interlayer insulating film, or an organic interlayer insulating film, or an organic SOG film and the like. The inorganic interlayer insulating film is a silicon oxide film, or a silicon oxide film containing phosphorus (PSG), or a silicon oxide film containing phosphorus and boron (BPSG). The organic interlayer insulating film is an acrylic film or a polyimide film. The organic SOG film is a mixture of organic and inorganic. The thickness of the interlayer insulating film is appropriately about 0.5 to 2 μm considering that the film has to be capable of leveling the substrate. In this embodiment, an acrylic film as an interlayer insulating film 440 is formed by spin coating to a thickness of 1.6 μm and subjected to a given heat treatment. Thereafter, contact holes 441 of a given measure are formed by normal photolithography and dry etching to pierce the interlayer insulating film 440 and the diffusion preventing film 439, as well as the underlying gate insulating film 409 (that has been considerably thinned when the gate electrodes are processed by dry etching). The contact holes 441 are formed such that they can be connected to the first impurity regions 419, 421, and 422 that are high-concentration n type impurity regions (n+ regions), third impurity regions 435 and 437 that are high-concentration p type impurity regions (p+ regions), and source wire electrodes 418abd that function as source wires. (See FIG. 8B.)

Then a first layer metal film 442, a second layer metal film 443, and an insulating film 444 are formed in succession by deposition to obtain a laminate for wires. To elaborate, the first layer metal film 442 is formed by long throw sputtering to a thickness of 30 to 200 nm, preferably 50 to 100 nm. A metal-based film selected from the group consisting of a Ta film, a TaN film, a TaSiN film, a TiN film, a TiSiN film, a W film, a WN film, a WSiN film, a WBN film, a TiW film, and an IrTa film is preferred as the material of the first layer metal film 442 from the standpoint of the diffusion preventing function. The first layer metal film 442 in this embodiment is a 50 nm thick film formed of WSiN by long throw sputtering. The second layer metal film 443 is formed from aluminum or an alloy mainly containing aluminum by long throw sputtering to a thickness of 100 to 600 nm, preferably 200 to 500 nm. The second layer metal film 443 in this embodiment is formed by long throw sputtering from aluminum containing 0.5% of copper to a thickness of 200 nm. The insulating film 444 is a silicon nitride film, silicon oxynitride film, or silicon oxide film formed by CVD or normal sputtering to a thickness of 30 to 200 nm, preferably 50 to 100 nm. The insulating film 444 in this embodiment is a silicon oxynitride film formed by plasma CVD to a thickness of 50 nm. When the first layer metal film 442 and the second layer metal film 443 are formed by deposition as a laminate for wires, long throw sputtering that is highly directional is chosen taking into account the step coverage with respect to contact holes of high aspect ratio. (See FIG. 9A.)

Next, low-resistant wire patterns 445abc (445a, 445b, and 445c) to 450abc are formed by photolithography and etching to be electrically connected to the first impurity regions 419 and 421 that are high-concentration n type impurity regions (n+ regions) and the third impurity regions 435 that are high-concentration p type impurity regions (p+ regions) in a driving circuit 506. At the same time, connection wire patterns 451abc, 453abc, and 454abc and gate wire patterns 452abc in a pixel region 507 are formed. This patterning step employs a process basically similar to the one used to form the gate electrode patterns 413abc (413a, 413b, and 413c) to 416abc previously. For that reason, the wire patterns are composed of the first layer metal film wires 445a to 454a, the second layer metal film wires 445b to 454b, and the insulating film patterns 445c to 454c, although different wire patterns have different pattern shapes and measures. The second layer metal film wires 445b to 454b each have side etching portions of a fixed measure. Lastly, the resist pattern (not shown) used as an etching mask is removed. In this patterning step, a terminal electrode (not shown in the drawing) for connection to an external power supply is formed in a specific region of an end of the substrate at the same time the wire patterns are formed. The terminal electrode (not shown) is connected to the wire patterns 445abc to 450abc and others and fixes the electric potential of the wire patterns 445abc to 450abc and others to a certain minus electric potential during the second electroplating described later. (See FIG. 9B.)

The second electroplating is carried out following a process similar to the first electroplating. Through the second electroplating, low-resistant metal portions 445d to 454d are formed. In forming 445d to 454d, concave regions surrounded by the first layer metal film wires 445a to 454a that are 50 nm thick WSiN films, the second layer metal film wires 445b to 454b that are 200 nm thick films of aluminum containing 0.5% of copper, and the insulating film patterns 445c to 454c that are 50 nm thick silicon oxynitride films are completely filled, and the first layer metal film wires 445a to 454a are slightly covered with 445d to 454d. In this embodiment, copper having a specific resistance of 1.55 to 2.23 μΩcm (temperature range: 0 to 100° C.) is formed into a film to obtain wires 445abd (445a, 445b, and 445d) to 450abd, connection wires 451abd, 453abd, and 454abd, and gate wires 452abd. (See FIG. 10A.)

The wires 445abd to 450abd are formed such that they are be electrically connected to the first impurity regions 419 and 412 and the third impurity regions 435 in the driving circuit 506. The connection wires 451abd are formed so as to electrically connect the first impurity regions 422 to the source wire electrodes 418abd that function as source wires in a pixel TFT 504. The connection wires 453abd are formed such that they are electrically connected to the first impurity regions 422 in the pixel TFT 504. The connection wires 454abd are formed such that they are electrically connected to the third impurity regions 437 of the capacitor storage 505. The gate wires 452abd are formed so as to electrically connect the plural gate electrodes 416abd of the pixel TFT 504. (See FIG. 10A.)

Next, regions in the insulating film patterns 453c and 454c that are positioned on the connection wires 453abd and the connection wires 454abd are partly removed using a resist pattern (not shown in the drawing) that has openings in positions corresponding to the regions to be removed. The regions in the insulating film patterns 453c and 454c are partly removed by dry etching and then the resist pattern used as the etching mask is removed. Thereafter, a transparent conductive film such as an ITO (abbreviation for indium tin oxide) film is formed by deposition to a thickness of 80 to 120 nm. The transparent conductive film in this embodiment is an ITO film formed by sputtering to a thickness of 100 nm. A pixel electrode 455 is then formed by normal photolithography and wet etching. The pixel electrode 455 is electrically connected to the first impurity regions 422 that are the source region and drain region of the pixel TFT 504 through the connection wires 453abd. The pixel electrode 455 is further electrically connected to the third impurity regions 437 of the capacitor storage 505 through the connection wires 454abd. (See FIG. 10B.)

As described above, when the present invention is applied to a gate electrode and wire of an active matrix liquid crystal display device, the resistance of the gate electrode and wire can be greatly reduced. Therefore the operation speed of the entire active matrix liquid crystal display device can be improved. To reduce the resistance of the gate electrode and wire, a low-resistant metal portion formed of copper or silver is attached to a part of the gate electrode and wire and a TFT could be contaminated by copper or silver. However, the present invention prevents the contamination by employing as a gate insulating film a silicon oxynitride film that has a diffusion preventing effect and by placing a diffusion preventing film that is a silicon nitride film under an interlayer insulating film. Moreover, the present invention employs a TFT having a GOLD structure in which an electric field relieving region is at an end of a gate electrode. Therefore the present invention is also improved in reliability against hot carriers.

Embodiment 2

The present invention will be described specific examples of electronic apparatuses incorporated with the semiconductor device witch applied low resistance for wirings of the present invention. Note that, the term semiconductor device refers to a device in general that utilizes semiconductor characteristics to function, and includes the semiconductor display devices in which a LSI manufactured on a semiconductor substrate and a TFT manufactured on a transparent insulating substrate are used to construct a circuit, etc. The LSI is mainly classified into a memory LSI such as a DRAM and a logic LSI such as a CPU, and such LSIs are applied to constituent parts of various electronic apparatuses. The semiconductor display device includes an active matrix type liquid crystal display device, an EL display device and the like and is applied to a display portion of electric apparatuses in various kinds. Specific examples of electronic apparatuses in which the semiconductor display device is implemented in the display portion are described with reference FIGS. 11A to 11F, 12A to 12D, and 13A to 13C.

As such electronic apparatuses, there are pointed out a video camera, digital camera, a projector (rear type or front type), a head mounted display (goggle type display), a game machine, a car navigation, a personal computer, a portable information terminal (mobile computer, portable telephone, electronic book etc.) and the like.

Figures 11A, 11B:
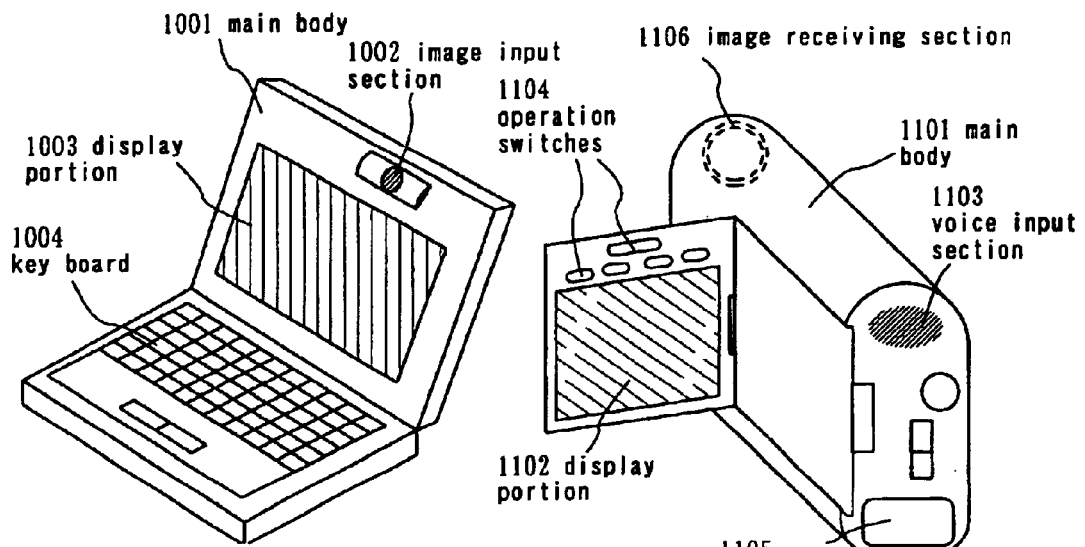
FIGS. 11A to 11F are schematic diagrams showing examples of electronic equipment with a semiconductor display device incorporated therein.

FIG. 11A shows a personal computer, which is composed of a main body 1001, a image input portion 1002, a display device 1003, and keyboards 1004. The personal computer can be completed by applying the present invention to the display device 1003 and other circuits.

FIG. 11B shows a video camera, which is composed of a main body 1101, a display device 1102, a sound input portion 1103, a operation switch 1104, a battery 1105, and an image receiving portion 1106. The video camera can be completed by applying the present invention to the display device 1102 and other circuits.

Figures 11C, 11D:
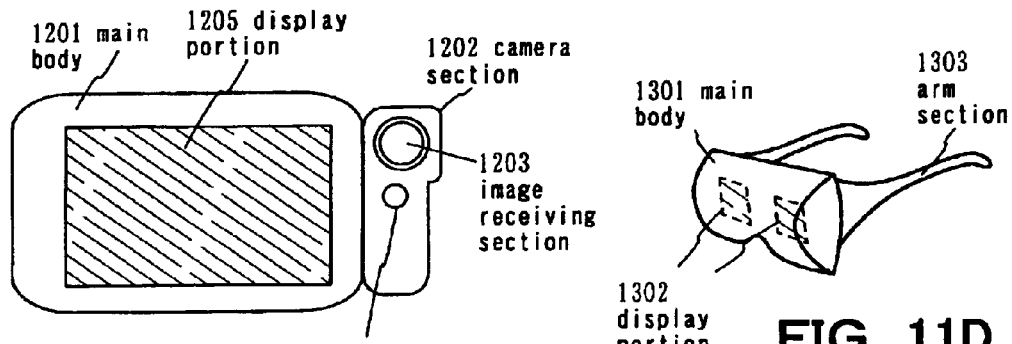

FIG. 11C shows a mobile computer, which is composed of a maid body 1201, a camera portion 1202, an image receiving portion 1203, an operation switch 1204, and a display device 1205. The mobile computer can be completed by applying the present invention to the display device 1205 and other circuits.

FIG. 11D shows a goggle type display, which is composed of a main body 1301, a display device 1302, and an arm portion 1303. The goggle type display can be completed by applying the present invention to the display device 1302 and other circuits.

Figures 11E, 11F:
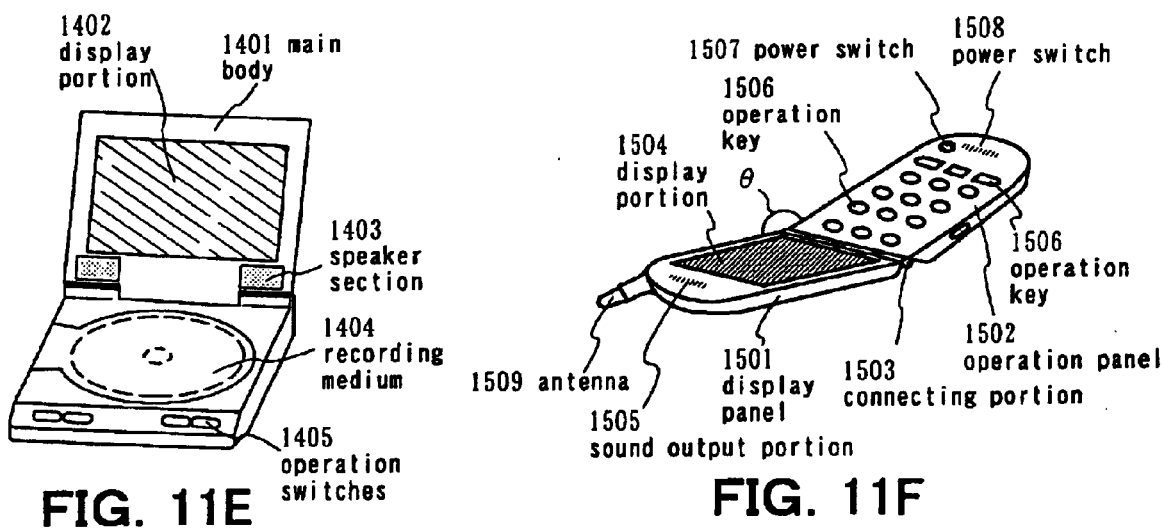

FIG. 11E shows a player using a record medium recorded with programs (hereinafter, referred to as record medium), which is composed of a main body 1401, a display device 1402, a speaker portion 1403, a record medium 1404 and an operation switch 1405. The player uses DVD (Digital Versatile Disc) or CD as the record medium and can enjoy music, enjoy movie and carry out game or Internet. The player using a record medium can be completed by applying the present invention to the display device 1402 and other circuits.

FIG. 11F shows a mobile telephone, which is composed of a display panel 1501, an operation panel 1502, a connection portion 1503, a display portion 1504, a sound output portion 1505, operation keys 1506, a power source switch 1507, a sound input portion 1508, and an antenna 1509. The display panel 1501 and the operation panel 1502 are connected to each other in the connecting portion 1503. In the connecting panel 1503, the angle θ of a face which is provided the display portion 1504 of the display panel 1501 and a face which is provided the operation key 1506 of the operation panel 1502 can be changed arbitrary. The portable telephone can be completed by applying the present invention to the display portion 1504.

Figure 12A:
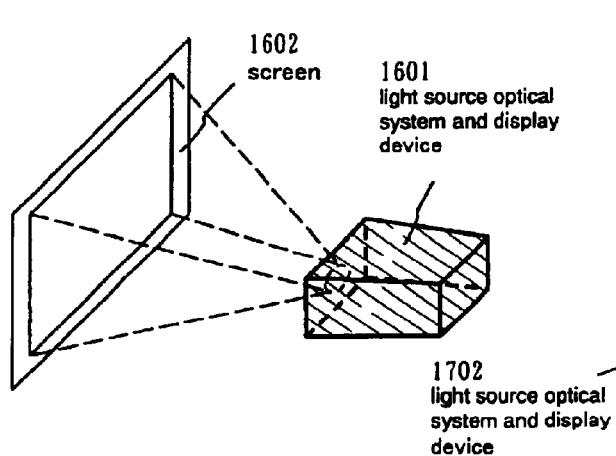
FIGS. 12A to 12D are schematic diagrams showing examples of electronic equipment with a semiconductor display device incorporated therein.

FIG. 12A shows a front type projector, which is composed of a light source optical system and a display device 1601, and a screen 1602. The front type projector can be completed by applying the present invention to the display device 1601 and other circuits.

Figure 12B:
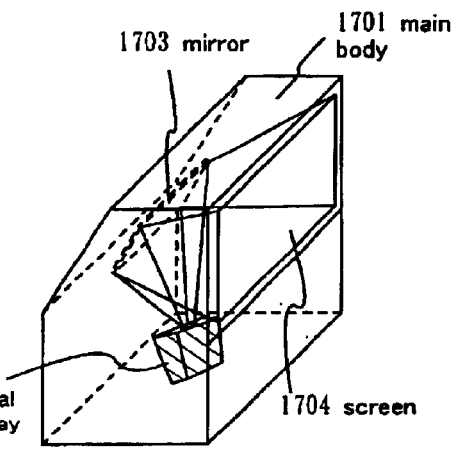

FIG. 12B shows a rear type projector, which is composed of a main body 1701, a light source optical system and a display device 1702, mirrors 1703 to 1704, and a screen 1705. The rear type projector can be completed by applying the present invention to the display device 1702 and other circuits.

Figure 12C:
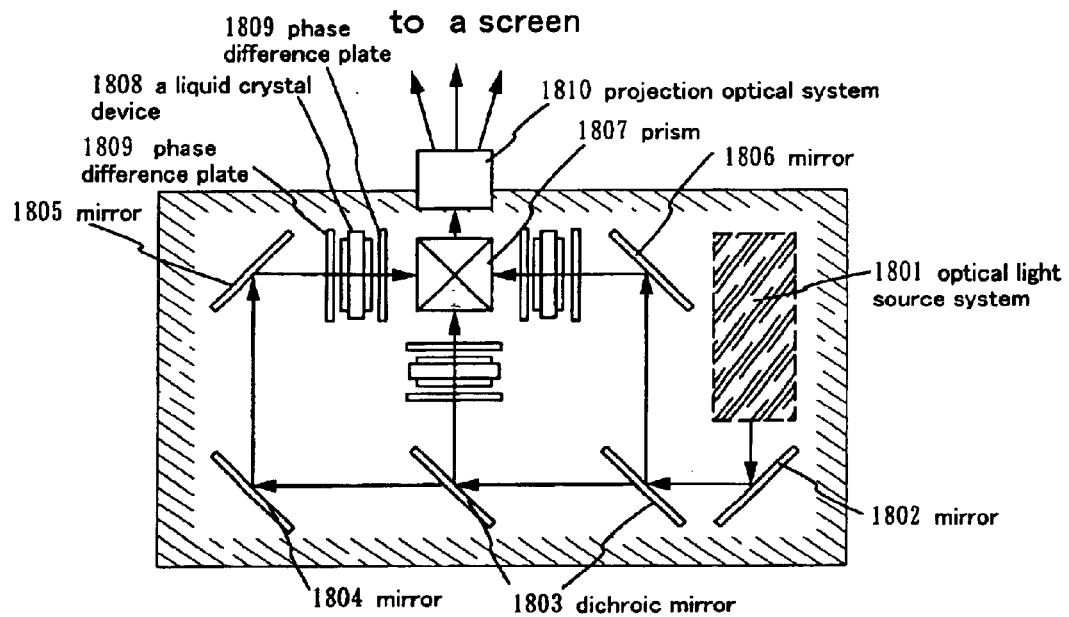

Further, FIG. 12C is a view showing an example of a structure of the light source optical system and the display device 1601 and a structure of the light source optical system and the display device 1702 in FIG. 12A and FIG. 12B, respectively. The light source optical system and the display devices 1601 and 1702 are constituted by a light source optical system 1801, mirrors 1802, and 1804 through 1806, a dichroic mirror 1803, an optical system 1807, a display device 1808, a phase difference plate 1809 and a projection optical system 1810. The projection optical system 1810 is constituted by a plurality of optical systems including a projection lens. Since three of the display devices 1808 are used, this configuration is called three plate type. Further, a person of executing the embodiment may pertinently provide an optical lens, a film having a polarization function, a film for adjusting a phase difference, an IR film or the like in an optical path shown by arrow marks in FIG. 12C.

Figure 12D:
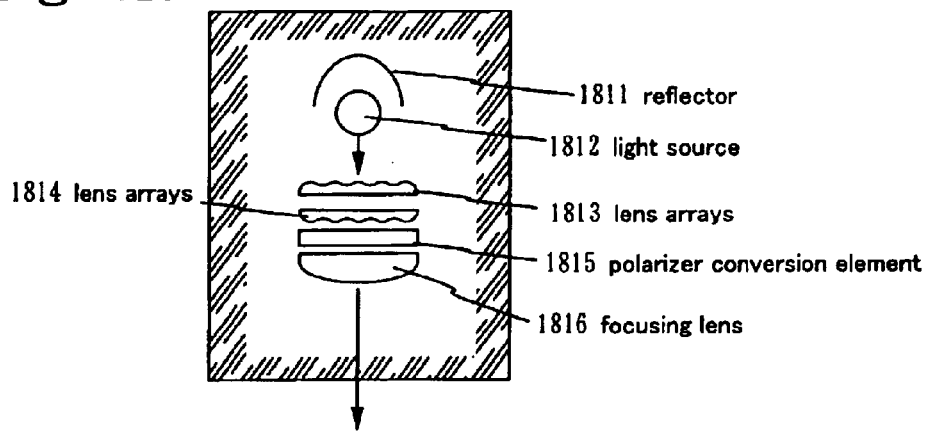

Further, FIG. 12D is a view showing an example of a structure of the light source optical system 1801 in FIG. 12C. According to the embodiment, the light source optical system 1801 is constituted by a reflector 1811, a light source 1812, lens arrays 1813 and 1814, a polarization conversion element 1815 and a focusing lens 1816. Further, the light source optical system shown in FIG. 12D is only an example and the embodiment is not particularly limited thereto. For example, a person of executing the embodiment may pertinently provide an optical lens, a film having a polarization function, a film for adjusting a phase difference, an IR film or the like in the light source optical system.

Figure 13A:
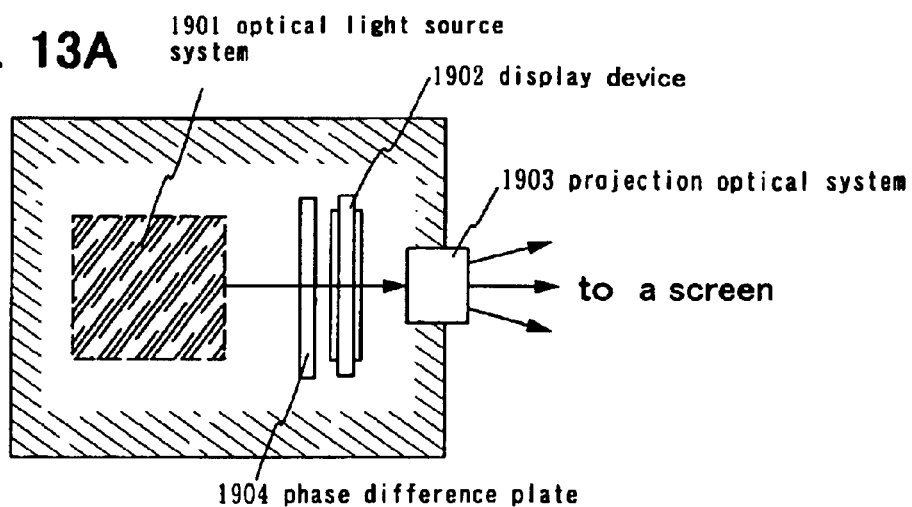
FIGS. 13A to 13C are schematic diagrams showing examples of electronic equipment with a semiconductor display device incorporated therein.

While FIG. 13A shows an example of a single plate type. The light source optical system and a display device shown in FIG. 13A, which is composed of a light source optical system 1901, a display device 1902, a projection optical system 1903, and a phase difference plate 1904. The projection optical system 1903 comprises a plurality of optical lenses including a projection lens. The light source optical system and a display device shown in FIG. 13A can be applied to the light source optical systems and display devices 1601 and 1702 shown in FIG. 12A and FIG. 12B. A light source optical system shown in FIG. 12D may be used as the light source optical system 1901. Note that a color filter is disposed in the display device 1902 (not shown) and the displayed image is colored.

Figure 13B:
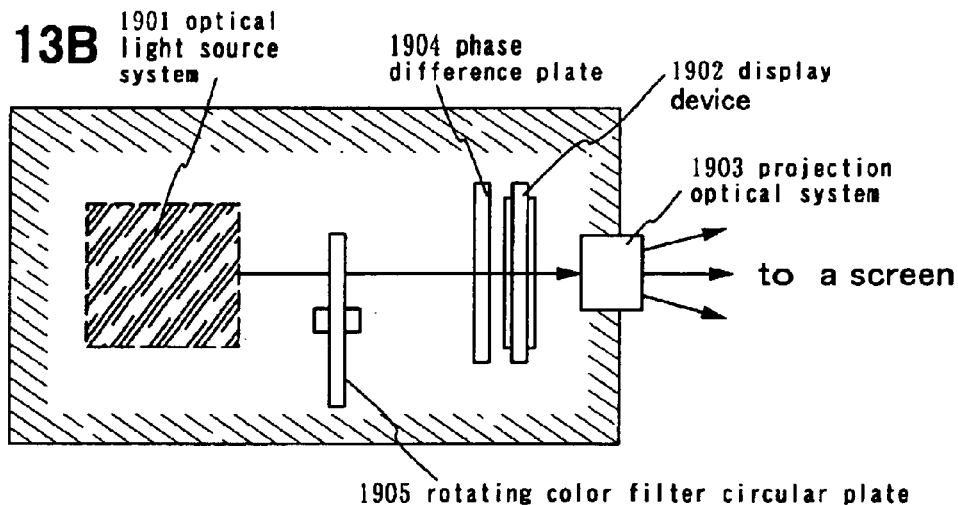

A light source optical system and a display device shown in FIG. 13B is an application of FIG. 13A and the displayed image is colored by using a rotating color filter circular plate 1905 of RGB in place of disposing a color filter. The light source optical system and a display device shown in FIG. 13B can be applied to the light source optical systems and display devices 1601 and 1702 shown in FIGS. 12A and 12B.

Figure 13C:
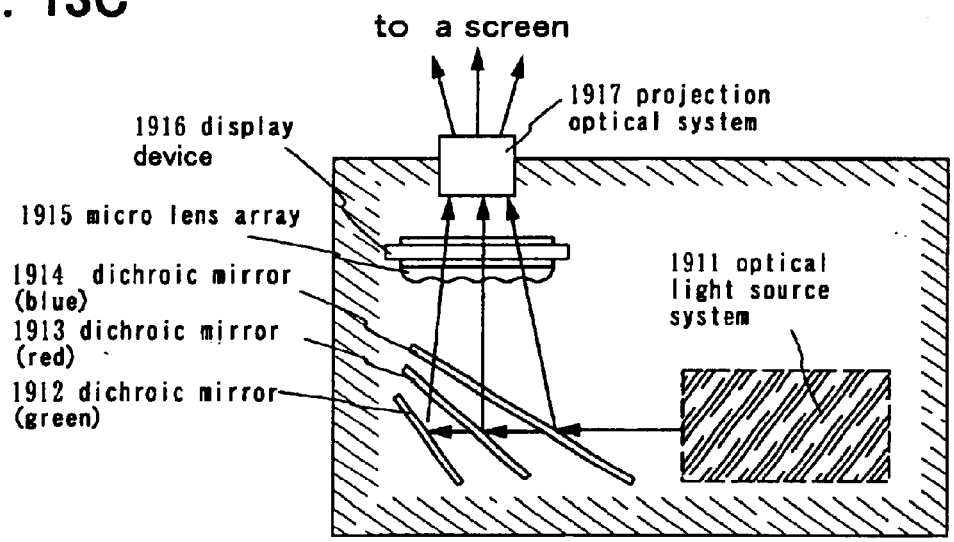

A light source optical system and a display device shown in FIG. 13C is called a color-filter-less single plate system. This system disposed a micro lens array 1915 in the display device 1916 and the displayed image is colored by using a dichroic mirror (green) 1912, a dichroic mirror (red) 1913 and a dichroic mirror (blue) 1914. The projection optical system 1917 comprises a plurality of optical lenses including a projection lens. The light source optical system and a display device shown in FIG. 13C can be applied to the light source optical systems and display devices 1601 and 1702 shown in FIGS. 12A and 12B. Further as a light source optical system 1911, an optical system using a coupling lens and a collimator lens in addition to the light source may be used.

As described above, the applicable range of the semiconductor device applying low resistance for wirings of the present invention is extremely large, and it is possible to apply to various electronic apparatuses incorporating a semiconductor device such as an active matrix type liquid crystal display device and an EL display device in addition to the electronic apparatus incorporating a LSI.

The effects of the present invention are described below.
(Effect 1)
The present invention can reduce the resistance of a wire of a semiconductor device owing to a low-resistant metal portion, which is attached to the wire and which is formed of copper or silver. Therefore the present invention is effective in improving the operation speed of the entire semiconductor device.
(Effect 2)
A low-resistant wire of the present invention is applicable to a gate electrode of a TFT formed on a transparent insulating substrate. In this case, by giving the TFT a GOLD structure in which an electric field relieving region is formed in a part of a semiconductor layer at an end of the gate electrode, an effect of reducing the resistance of the gate electrode and an effect of improving the reliability against hot carriers can be obtained both.

What is claimed is:
1. A semiconductor device comprising:
a semiconductor element;
an interlayer insulating film formed over the semiconductor element; and
a conductor formed over the interlayer insulating film, said conductor comprising a first layer metal film, a second layer metal film, and low-resistant metal portions,
wherein said second layer metal film is formed on the first layer metal film, the first layer metal film extending beyond side edges of said second layer metal film, and
wherein each of the low-resistant metal portions is in contact with each of the side edges of the second layer metal film.

2. A semiconductor device according to claim 1, further comprising a semiconductor substrate provided with said semiconductor element, or a transparent insulating substrate over which said semiconductor element is provided.

3. A semiconductor device according to claim 1, wherein said semiconductor element comprises at least one of a MOS transistor and bipolar transistor.

4. A semiconductor device according to claim 1, wherein said semiconductor element is a thin film transistor provided over a transparent insulating substrate.

5. A semiconductor device according to claim 1, wherein said interlayer insulating film comprises at least one film selected from a silicon oxide film, a silicon oxide film containing phosphorus, a silicon oxide film containing phosphorus and boron, an acrylic film, a polyimide film, and an organic SOG film.

6. A semiconductor device according to claim 1, wherein said first layer metal film comprises at least one material selected from the group consisting of Ta, TaN, TaSiN, TiN, TiSiN, W, WN, WSiN, WBN, TiW, and IrTa.

7. A semiconductor device according to claim 1, wherein said second layer metal film is either aluminum or an alloy mainly containing aluminum.

8. A semiconductor device according to claim 1, wherein said low-resistant metal portion comprises at least one of copper and silver having a specific resistance smaller than that of aluminum.

9. A semiconductor device according to claim 1, further comprising an insulating film on a top surface of the second layer metal film and the low-resistance metal portions.

10. A semiconductor device according to claim 1, wherein a diffusion preventing film is formed over said interlayer insulating film.

11. A semiconductor device according to claim 10, wherein said diffusion preventing film comprises at least one of a silicon nitride film and a silicon oxynitride film.

12. A semiconductor device comprising:
a semiconductor element;
a diffusion preventing film formed over the semiconductor element;
an interlayer insulating film formed on said diffusion preventing film; and
a conductor formed over the interlayer insulating film, said conductor comprising a first layer metal film, a second layer metal film, and low-resistant metal portions,
wherein the second layer metal film is formed on the first layer metal film, the first layer metal film extending beyond side edges of said second layer metal film, and
wherein each of the low-resistant metal portions is attached to each of the side edges of the second layer metal film.

13. A semiconductor device according to claim 12, further comprising a semiconductor substrate provided with said semiconductor element, or a transparent insulating substrate over which said semiconductor element is provided.

14. A semiconductor device according to claim 12, wherein said semiconductor element comprises at least one of a MOS transistor and bipolar transistor.

15. A semiconductor device according to claim 12, wherein said semiconductor element is a thin film transistor formed on a transparent insulating substrate.

16. A semiconductor device according to claim 12, wherein said interlayer insulating film comprises one film selected from a silicon oxide film, a silicon oxide film containing phosphorus, a silicon oxide film containing phosphorus and boron, an acrylic film, a polyimide film, and an organic SOG film.

17. A semiconductor device according to claim 12, wherein said first layer metal film comprises one material selected from the group consisting of Ta, TaN, TaSiN, TiN, TiSiN, W, WN, WSiN, WBN, TiW, and IrTa.

18. A semiconductor device according to claim 12, wherein said second layer metal film is either aluminum or an alloy mainly containing aluminum.

19. A semiconductor device according to claim 12, wherein said low-resistant metal portion comprises at least one of copper and silver having a specific resistance smaller than that of aluminum.

20. A semiconductor device according to claim 12, wherein said diffusion preventing film comprises at least one of a silicon nitride film and a silicon oxynitride film.

21. A semiconductor device according to claim 12, further comprising an insulating film on a top surface of the second layer metal film and the low-resistance metal portions.

22. A semiconductor device according to claim 12, wherein a diffusion preventing film is formed over said interlayer insulating film.

23. A semiconductor device according to claim 22, wherein the diffusion preventing film comprises at least one of a silicon nitride film and a silicon oxynitride film.

24. A semiconductor device comprising:
a thin film transistor;
wherein said thin film transistor has a semiconductor layer having a source region, a drain region, and an electric field relieving region, a gate insulating film formed on said semiconductor layer, and a gate electrode formed on said gate insulating film,
wherein said gate electrode comprises a first layer metal film, a second layer metal film, and low-resistant metal portions,
wherein the first layer metal film extends beyond side edges of said second layer metal film,
wherein ends of said low-resistant metal portions are attached to each of the side edges of the second layer metal film,
wherein said source region and said drain region are not overlapped with said first layer metal film; and
wherein an entire part of said electric field relieving region is overlapped with said first layer metal film but is not overlapped with said second layer metal film.

25. A semiconductor device according to claim 24, wherein said semiconductor layer is either a polycrystalline silicon film or a crystalline silicon film.

26. A semiconductor device according to claim 24, wherein said gate insulating film is a silicon oxynitride film.

27. A semiconductor device according to claim 24, wherein said source region and said drain region are n-type high-concentration impurity regions and said electric field relieving region is an n-type low-concentration impurity region.

28. A semiconductor device according to claim 24, wherein said source region and said drain region are p-type high-concentration impurity regions and said electric field relieving region is a p-type low-concentration impurity region.

29. A semiconductor device according to claim 24, wherein said first layer metal film comprises one material selected from the group consisting of Ta, TaN, TaSiN, TiN, TiSiN, W, WN, WSiN, WBN, TiW, and IrTa.

30. A semiconductor device according to claim 24, wherein said second layer metal film is either aluminum or an alloy mainly containing aluminum.

31. A semiconductor device according to claim 24, wherein said low-resistant metal portion comprises at least one of copper and silver having a specific resistance smaller than that of aluminum.

32. A method of manufacturing a semiconductor device, comprising:
forming a first layer metal film over a coat by deposition;
forming a second layer metal film on said first layer metal film by deposition;
forming an insulating film on said second layer metal film by deposition;
forming a resist pattern for forming a conductor;
etching a laminate comprising said first layer metal film, said second layer metal film, and said insulating film using said resist pattern as a mask to form a laminate conductor pattern having side etching portions in said second layer metal film;
removing said resist pattern; and
forming a low-resistant metal film on an exposed surface of said metal film by electroplating to form a laminate conductor using as a seed portion a metal film, said laminate conductor including said first layer metal film and said second layer metal film.

33. A method of manufacturing a semiconductor device according to claim 32, wherein at least one material selected from the group consisting of Ta, TaN, TaSiN, TiN, TiSiN, W, WN, WSiN, WBN, TiW, and IrTa is formed by deposition as said first layer metal film.

34. A method of manufacturing a semiconductor device according to claim 32, wherein either aluminum film or an alloy film mainly containing aluminum is formed by deposition as said second layer metal film.

35. A method of manufacturing a semiconductor device according to claim 32, wherein at least one of a silicon nitride film, a silicon oxynitride film, and silicon oxide film is formed by deposition as said insulating film.

36. A method of manufacturing a semiconductor device according to claim 32, wherein at least one of copper and silver having a specific resistance smaller than that of aluminum is formed as said low-resistant metal film.

37. A method of manufacturing a semiconductor device according to claim 32, further comprising:
forming a diffusion preventing film over the interlayer insulating film after forming said interlayer insulating film.

38. A method of manufacturing a semiconductor device, comprising:
forming an interlayer insulating film over one main surface of a substrate over which a plurality of semiconductor elements are arranged;
forming a first layer metal film over said interlayer insulating film by deposition;
forming a second layer metal film on said first layer metal film by deposition;
forming an insulating film on said second layer metal film by deposition;
forming a resist pattern for forming a conductor;
etching a laminate comprising said first layer metal film, said second layer metal film, and said insulating film using said resist pattern as a mask to form a laminate conductor pattern that has side etching portions in said second layer metal film;

removing said resist pattern; and forming a low-resistant metal film on an exposed surface of said metal film by electroplating to form a laminate conductor using as a seed portion a metal film, said laminate conductor including said first layer metal film and said second layer metal film.

39. A method of manufacturing a semiconductor device according to claim 38, wherein at least one of MOS transistors and bipolar transistors is arranged as said semiconductor elements on a semiconductor substrate.

40. A method of manufacturing a semiconductor device according to claim 38, wherein thin film transistors are arranged as said semiconductor elements on a transparent insulating substrate.

41. A method of manufacturing a semiconductor device according to claim 38, wherein at least one of a silicon oxide film, a silicon oxide film containing phosphorus, a silicon oxide film containing phosphorus and boron, an acrylic film, a polyimide film, and an organic SOG is formed by deposition as said interlayer insulating film.

42. A method of manufacturing a semiconductor device according to claim 38, wherein at least one material selected from the group consisting of Ta, TaN, TaSiN, TiN, TiSiN, W, WN, WSiN, WBN, TiW, and IrTa is formed by deposition as said first layer metal film.

43. A method of manufacturing a semiconductor device according to claim 38, wherein either aluminum film or an alloy film mainly containing aluminum is formed by deposition as the second layer metal film.

44. A method of manufacturing a semiconductor device according to claim 38, wherein at least one of a silicon nitride film, a silicon oxynitnde film and silicon oxide film is formed by deposition as said insulating film.

45. A method of manufacturing a semiconductor device according to claim 38, wherein at least one of copper and silver having a specific resistance smaller than that of aluminum is formed as said low-resistant metal film.

46. A method of manufacturing a semiconductor device according to claim 38, further comprising:

forming a diffusion preventing film over said interlayer insulating film after forming said interlayer insulating film.

47. A method of manufacturing a semiconductor device, comprising:

forming a diffusion preventing film over one main surface of a substrate over which a plurality of semiconductor elements are arranged;

forming an interlayer insulating film over said diffusion preventing film by deposition;

forming a first layer metal film over said interlayer insulating film by deposition;

forming a second layer metal film on said first layer metal film by deposition;

forming an insulating film on said second layer metal film by deposition;

forming a resist pattern for forming a conductor;

etching a laminate consisting of said first layer metal film, said second layer metal film, and said insulating film using said resist pattern as a mask to form a laminate conductor pattern having side etching portions in said second layer metal film;

removing said resist pattern; and forming a low-resistant metal film on an exposed surface of said metal film by electroplating to form a laminate conductor using as a seed portion a metal film, said laminate conductor including said first layer metal film and said second layer metal film.

48. A method of manufacturing a semiconductor device according to claim 47, wherein at least one of MOS transistors and bipolar transistors is arranged as said semiconductor elements on a semiconductor substrate.

49. A method of manufacturing a semiconductor device according to claim 47, wherein thin film transistors are arranged as said semiconductor elements on a transparent insulating substrate.

50. A method of manufacturing a semiconductor device according to claim 47, wherein at least one of a silicon oxide film, a silicon oxide film containing phosphorus, a silicon oxide film containing phosphorus and boron, an acrylic film, a polyimide film, and an organic SOG is formed by deposition as said interlayer insulating film.

51. A method of manufacturing a semiconductor device according to claim 47, wherein at least one of a silicon nitride film and a silicon oxynitride film is formed by deposition as said diffusion preventing film.

52. A method of manufacturing a semiconductor device according to claim 47, wherein at least one material selected from the group consisting of Ta, TaN, TaSiN, TiN, TiSiN, W, WN, WSiN, WBN, TiW, and IrTa is formed by deposition as said first layer metal film.

53. A method of manufacturing a semiconductor device according to claim 47, wherein either aluminum film or an alloy film mainly containing aluminum is formed by deposition as said second layer metal film.

54. A method of manufacturing a semiconductor device according to claim 47, wherein at least one of a silicon nitride film, a silicon oxynitride film and silicon oxide film is formed by deposition as said insulating film.

55. A method of manufacturing a semiconductor device according to claim 47, wherein at least one of copper and silver having a specific resistance smaller than that of aluminum is formed as said low-resistant metal film.

56. A method of manufacturing a semiconductor device, comprising:

forming a semiconductor layer over a transparent insulating substrate;

forming a gate insulating film by deposition so as to cover said semiconductor layer;

introducing nitrogen as an element to said gate insulating film by heating said gate insulating film in an atmosphere containing a nitrogen component to form a nitrogen-containing gate insulating film;

forming a first layer metal film on said nitrogen-containing gate insulating film by deposition;

forming a second layer metal film on said first layer metal film by deposition;

forming an insulating film on said second layer metal film by deposition;

forming a resist pattern for forming a gate electrode;

etching a laminate comprising said first layer metal film, said second layer metal film, said insulating film using said resist pattern as a mask to form a laminate gate electrode pattern having side etching portions in said second layer metal film;

removing said resist pattern;

forming, by implantation of an impurity element of one conductivity type, a first impurity region in a part of said semiconductor layer that is outside said laminate gate electrode pattern and, at the same time, forming a second impurity region in a part of said semiconductor layer where said first layer metal film is exposed through said second layer metal film in said laminate gate electrode pattern; and forming a low-resistant metal film on an exposed surface of said metal film by electroplating to form a laminate electrode using as a seed portion a metal film electrode, said laminate conductor including said first layer metal film and said second layer metal film.

57. A method of manufacturing a semiconductor device according to claim 56, wherein the semiconductor layer is either a polycrystalline silicon film or a crystalline silicon film.

58. A method of manufacturing a semiconductor device according to claim 56, wherein a silicon oxide film is formed by deposition as said gate insulating film.

59. A method of manufacturing a semiconductor device according to claim 56, wherein phosphorus (P) that is an n-type impurity or boron (B) that is a p type impurity is implanted as the impurity element of one conductivity type.

60. A method of manufacturing a semiconductor device according to claim 56, wherein said impurity concentration of said first impurity region is set higher than said impurity concentration of said second impurity region.

61. A method of manufacturing a semiconductor device according to claim 56, wherein at least one material selected from the group consisting of Ta, TaN, TaSiN, TiN, TiSiN, W, WN, WSiN, WBN, TiW, and IrTa is formed by deposition as said first layer metal film.

62. A method of manufacturing a semiconductor device according to claim 56, wherein at least one of aluminum film or an alloy film mainly containing aluminum is formed by deposition as said second layer metal film.

63. A method of manufacturing a semiconductor device according to claim 56, wherein at least one of a silicon nitride film, a silicon oxynitride film, and silicon oxide film is formed by deposition as said insulating film.

64. A method of manufacturing a semiconductor device according to claim 56, wherein at least one of copper and silver having a specific resistance smaller than that of aluminum is formed as said low-resistant metal film.

65. A method of manufacturing a semiconductor device according to claim 56, further comprising:

forming a diffusion preventing film over said interlayer insulating film after forming said interlayer insulating film.

66. A semiconductor device according to claim 1, wherein each of said low-resistant metal portions is formed on a part of the first layer metal.

67. A semiconductor device according to claim 12, wherein each of said low-resistant metal portions is formed on a part of the first layer metal.

68. A semiconductor device comprising:

a thin film transistor, said thin film transistor having a semiconductor layer having a source region, a drain region, a gate insulating film formed on said semiconductor layer, and a gate electrode formed on said gate insulating film, wherein said gate electrode comprises a first layer metal film, a second layer metal film, and low-resistant metal portions, wherein said second layer metal film is formed on said first layer metal film, the first layer metal film extending beyond side edges of said second layer metal film, and wherein said low-resistant metal portion is attached to each of the side edges of the second layer metal film.

69. A semiconductor device according to claim 68, wherein said semiconductor layer is either a polycrystalline silicon film or a crystalline silicon film.

70. A semiconductor device according to claim 68, wherein said gate insulating film is a silicon oxynitride film.

71. A semiconductor device according to claim 68, wherein said source region and said drain region are n-type high-concentration impurity regions.

72. A semiconductor device according to claim 68, wherein said source region and said drain region are p-type high-concentration impurity regions.

73. A semiconductor device according to claim 68, wherein said first layer metal film comprises one material selected from the group consisting of Ta, TaN, TaSiN, TiN, TiSiN, W, WN, WSiN, WBN, TiW, and IrTa.

74. A semiconductor device according to claim 68, wherein said second layer metal film is either aluminum or an alloy mainly containing aluminum.

75. A semiconductor device according to claim 68, wherein said low-resistant metal portion comprises at least one of copper and silver having a specific resistance smaller than that of aluminum.

76. An electronic device having the semiconductor device according to claim 1, wherein said electronic device is selected from the group consisting of a display device, a digital still camera, a lap-top computer, a mobile computer, a portable image reproduction apparatus, a goggle type display, a video camera, and a mobile telephone.

77. An electronic device having the semiconductor device according to claim 12, wherein said electronic device is selected from the group consisting of a display device, a digital still camera, a lap-top computer, a mobile computer, a portable image reproduction apparatus, a goggle type display, a video camera, and a mobile telephone.

78. An electronic device having the semiconductor device according to claim 24, wherein said electronic device is selected from the group consisting of a display device, a digital still camera, a lap-top computer, a mobile computer, a portable image reproduction apparatus, a goggle type display, a video camera, and a mobile telephone.

* * * * *